(12) United States Patent
Tomoda

(10) Patent No.: US 12,016,117 B2
(45) Date of Patent: Jun. 18, 2024

(54) EXTENSIBLE AND CONTRACTIBLE MOUNTING BOARD

(71) Applicant: Murata Manufacturing Co., Ltd., Nagaokakyo (JP)

(72) Inventor: Takahito Tomoda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 309 days.

(21) Appl. No.: 17/464,049

(22) Filed: Sep. 1, 2021

(65) Prior Publication Data

US 2021/0400806 A1    Dec. 23, 2021

Related U.S. Application Data

(63) Continuation of application No. PCT/JP2020/008336, filed on Feb. 28, 2020.

(30) Foreign Application Priority Data

Mar. 25, 2019    (JP) .................................. 2019-056713

(51) Int. Cl.
*H05K 1/02*    (2006.01)
*H05K 1/03*    (2006.01)
(Continued)

(52) U.S. Cl.
CPC ......... *H05K 1/0296* (2013.01); *H05K 1/0283* (2013.01); *H05K 1/032* (2013.01);
(Continued)

(58) Field of Classification Search
CPC .... H05K 1/0283; H05K 1/032; H05K 1/0393; H05K 1/181; H05K 1/189; H05K 3/284
(Continued)

(56) References Cited

U.S. PATENT DOCUMENTS 6,506,978 B1 *    1/2003    Furihata ............... H05K 3/4617
                                                                          174/262
8,883,287 B2 *    11/2014    Boyce ..................... B29C 59/16
                                                                          174/254
(Continued)

FOREIGN PATENT DOCUMENTS

JP    H08139437 A    5/1996
JP    2003332743 A    11/2003
(Continued)

OTHER PUBLICATIONS

International Search Report issued for PCT/JP2020/008336, dated Apr. 7, 2020.
(Continued)

*Primary Examiner* — Anatoly Vortman
(74) *Attorney, Agent, or Firm* — ArentFox Schiff LLP

(57) ABSTRACT

An extensible and contractible mounting board that includes an extensible and contractible substrate; an extensible and contractible wiring line on one main surface of the extensible and contractible substrate; an electronic component electrically connected to the extensible and contractible wiring line; and a resin portion in contact with the extensible and contractible wiring line and overlapping an end portion of a connection region between the extensible and contractible wiring line and the electronic component in a plan view of the extensible and contractible mounting board, the resin portion having a cutout portion that overlaps the extensible and contractible wiring line. A Young's modulus of the resin portion is higher than a Young's modulus of the extensible and contractible substrate.

16 Claims, 13 Drawing Sheets

(51) Int. Cl.
*H05K 1/18* (2006.01)
*H05K 3/28* (2006.01)

(52) U.S. Cl.
CPC .......... *H05K 1/0393* (2013.01); *H05K 1/181* (2013.01); *H05K 1/189* (2013.01); *H05K 3/284* (2013.01)

(58) Field of Classification Search
USPC .......................................................... 174/254
See application file for complete search history.

(56) References Cited

U.S. PATENT DOCUMENTS

| | | | | |
|---|---|---|---|---|
| 9,089,050 | B2* | 7/2015 | Kajiya | H05K 1/0206 |
| 9,763,323 | B2* | 9/2017 | Iwase | H05K 1/095 |
| 9,961,766 | B2* | 5/2018 | Iwase | H05K 1/0393 |
| 10,034,370 | B2* | 7/2018 | Iwase | H05K 1/0283 |
| 10,076,025 | B2* | 9/2018 | Iwase | H05K 3/4617 |
| 10,104,779 | B2* | 10/2018 | Ogura | H05K 1/0281 |
| 10,306,755 | B2* | 5/2019 | Ogura | H05K 1/0281 |
| 10,455,695 | B2* | 10/2019 | Yamada | H05K 1/0283 |
| 11,406,011 | B2* | 8/2022 | Tomoda | H05K 1/0283 |
| 11,659,654 | B2* | 5/2023 | Tomoda | H05K 1/0283 174/254 |
| 2008/0257589 | A1* | 10/2008 | Ostmann | H05K 1/189 174/254 |
| 2009/0107703 | A1* | 4/2009 | Abe | H01L 23/49822 174/254 |
| 2010/0238636 | A1* | 9/2010 | Mascaro | H05K 3/143 361/749 |
| 2012/0026700 | A1* | 2/2012 | Furuta | H05K 3/361 361/750 |
| 2015/0211718 | A1* | 7/2015 | Diekmann | F21V 17/12 174/254 |
| 2016/0270223 | A1* | 9/2016 | Cherenack | H05K 1/028 |
| 2017/0086291 | A1 | 3/2017 | Cotton et al. | |
| 2020/0281073 | A1* | 9/2020 | Okimoto | H05K 1/189 |
| 2021/0267050 | A1* | 8/2021 | Obata | G01B 7/16 |
| 2023/0073700 | A1* | 3/2023 | Asai | H05K 1/0281 |

FOREIGN PATENT DOCUMENTS

| | | |
|---|---|---|
| JP | 2017513237 A | 5/2017 |
| JP | 2017110217 A | 6/2017 |
| JP | 2018164015 A | 10/2018 |
| JP | 2019029514 A | 2/2019 |
| WO | 2007119608 A1 | 10/2007 |
| WO | 2017129866 A1 | 8/2017 |

OTHER PUBLICATIONS

Japanese Office Action issued for JP Application No. 2021-508865, dated Apr. 13, 2021.
Written Opinion of the International Searching Authority issued for PCT/JP2020/008336, dated Apr. 7, 2020.

* cited by examiner

EXTENSIBLE AND CONTRACTIBLE MOUNTING BOARD

CROSS REFERENCE TO RELATED APPLICATIONS

The present application is a continuation of International application No. PCT/JP2020/008336, filed Feb. 28, 2020, which claims priority to Japanese Patent Application No. 2019-056713, filed Mar. 25, 2019, the entire contents of each of which are incorporated herein by reference.

FIELD OF THE INVENTION

The present invention relates to an extensible and contractible mounting board.

BACKGROUND OF THE INVENTION

In recent years, a state of a living body (for example, a human body) and the like have been managed by acquiring and analyzing biological information with the use of a wiring line board.

An electronic component may be mounted on such a wiring line board. For example, Patent Document 1 discloses a rigid flexible board on which a semiconductor element is mounted by a flip chip bonding method. Patent Document 2 discloses a flexible printed wiring line board on which components are mounted.

Patent Document 1: Japanese Patent Application Laid-Open No. 2003-332743
Patent Document 2: Japanese Patent Application Laid-Open No. H8-139437

SUMMARY OF THE INVENTION

A mounting board on which an electronic component is mounted needs to have extensible and contractible properties such that the mounting board can follow the movement of a living body when the mounting board is attached to the living body. When the mounting board having such extensible and contractible properties is extended and contracted, stress is likely to be concentrated in a connection region between a wiring line and the electronic component, and as a result, the wiring line may be disconnected or a resistance of the wiring line may increase.

Patent Document 1 does not disclose that the rigid flexible board has extensible and contractible properties, and is not intended to suppress the disconnection and a resistance increase of the wiring line when the mounting board extends and contracts.

Patent Document 2 does not disclose that the flexible printed wiring line board has extensible and contractible properties, and is not intended to suppress the disconnection of the wiring line and the resistance increase when the mounting board extends and contracts.

The present invention has been made to solve the above problems, and an object of the present invention is to provide an extensible and contractible mounting board capable of suppressing disconnection and a resistance increase of an extensible and contractible wiring line when the extensible and contractible mounting board extends and contracts.

An extensible and contractible mounting board according to the present invention includes an extensible and contractible substrate; an extensible and contractible wiring line on one main surface of the extensible and contractible substrate; an electronic component electrically connected to the extensible and contractible wiring line; and a hard resin portion in contact with the extensible and contractible wiring line and overlapping an end portion of a connection region between the extensible and contractible wiring line and the electronic component in a plan view of the extensible and contractible mounting board, the resin portion having a cutout portion that overlaps the extensible and contractible wiring line. A Young's modulus of the hard resin portion is higher than a Young's modulus of the extensible and contractible substrate.

According to the present invention, it is possible to provide the extensible and contractible mounting board capable of suppressing the disconnection and an increase in resistance in the extensible and contractible wiring line when the extensible and contractible mounting board extends and contracts.

DETAILED DESCRIPTION OF THE INVENTION

Figure 1:
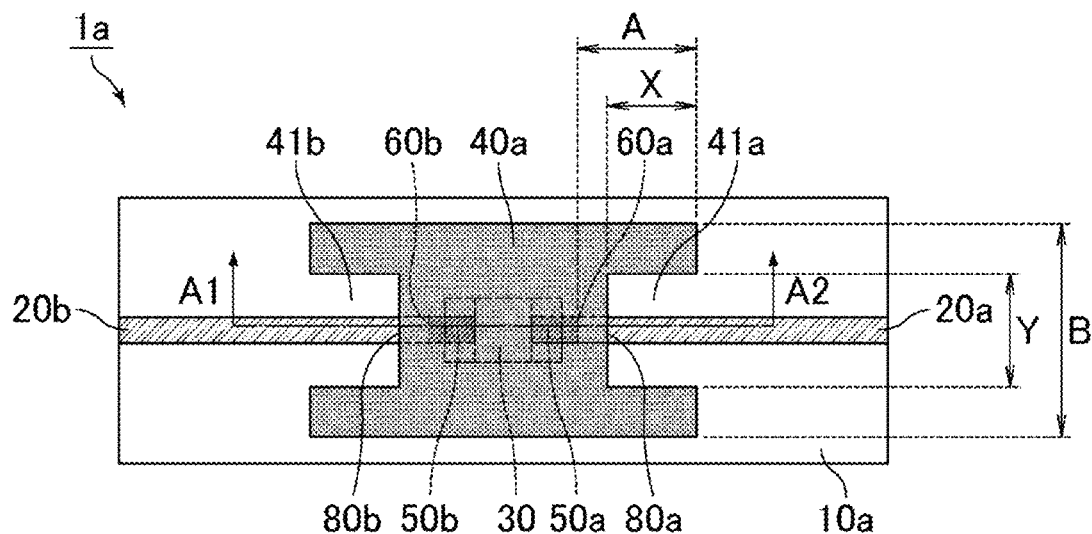
FIG. 1 is a schematic plan view illustrating an extensible and contractible mounting board according to Embodiment 1 of the present invention.

Hereinafter, an extensible and contractible mounting board according to the present invention will be described. The present invention is not limited to the following configurations, and may be appropriately changed without departing from the gist of the present invention. A combination of a plurality of individual preferred configurations to be described below is also the present invention.

Needless to say, the embodiments to be illustrated below are examples, and partial configurations illustrated in different embodiments can be replaced or combined. In Embodiment 2 and subsequent embodiments, matters common to Embodiment 1 will not be described, and only different points will be mainly described. In particular, similar actions and effects due to similar configurations will not be mentioned sequentially for each embodiment. In the following description, when the embodiments are not particularly distinguished, the extensible and contractible mounting board of each embodiment is simply referred to as the extensible and contractible mounting board according to the present invention.

In the present specification, a "thickness" means a dimension in a direction perpendicular to a surface of an extensible and contractible substrate in a section view. The "thickness" and the "length" are shown as those in a state in which the extensible and contractible mounting board does not extend and contract unless otherwise specified.

The extensible and contractible mounting board according to the present invention includes an extensible and contractible substrate, an extensible and contractible wiring line on one main surface of the extensible and contractible substrate, an electronic component electrically connected to the extensible and contractible wiring line, and a hard resin portion in contact with the extensible and contractible wiring line and which overlaps an end portion of a connection region between the extensible and contractible wiring line and the electronic component in a plan view of the extensible and contractible mounting board. A Young's modulus of the hard resin portion is higher than a Young's modulus of the extensible and contractible substrate, and a cutout portion that overlaps the extensible and contractible wiring line is provided in the hard resin portion. The extensible and contractible mounting board according to the present invention may at least have a region in which the extensible and contractible substrate, the extensible and contractible wiring line, the electronic component, and the hard resin portion are arranged with the above positional relationship, and an example in which a plurality of extensible and contractible wiring lines is arranged is shown in each of the embodiments to be illustrated below.

Embodiment 1

In the extensible and contractible mounting board according to the present invention, the cutout portion may overlap the extensible and contractible wiring line in a plan view of the extensible and contractible mounting board. In the extensible and contractible mounting board according to the present invention, the hard resin portion may be in contact with a side of the extensible and contractible wiring line opposite to the extensible and contractible substrate and may cover the electronic component.

Such an example will be described as an extensible and contractible mounting board according to Embodiment 1 of the present invention.

Figure 2:
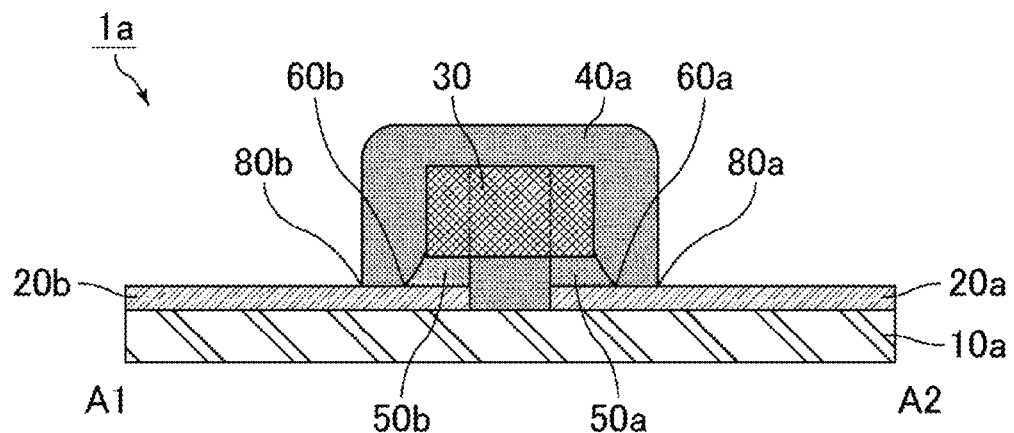
FIG. 2 is a schematic sectional view illustrating a portion corresponding to line segment A1-A2 in FIG. 1.

FIG. 1 is a schematic plan view showing the extensible and contractible mounting board according to Embodiment 1 of the present invention. FIG. 2 is a schematic sectional view showing a portion corresponding to line segment A1-A2 in FIG. 1. As shown in FIGS. 1 and 2, an extensible and contractible mounting board 1a includes an extensible and contractible substrate 10a, extensible and contractible wiring lines 20a and 20b, an electronic component 30, and a hard resin portion 40a.

Examples of a constituent material of the extensible and contractible substrate 10a include resins such as elastomer-based resins such as silicone-based resins, acrylic-based resins, olefin-based resins, urethane-based resins, and styrene-butadiene-based resins. Examples of the urethane-based resins include thermoplastic polyurethane.

When the extensible and contractible mounting board 1a is attached to a living body, a thickness of the extensible and contractible substrate 10a is preferably 100 μm or less, more preferably 50 μm or less, from the viewpoint of not inhibiting the extension and contraction of a surface of the living body. The thickness of the extensible and contractible substrate 10a is preferably 0.1 µm or more.

The extensible and contractible wiring lines 20a and 20b are arranged on one main surface of the extensible and contractible substrate 10a.

It is preferable that a mixture of conductive particles and a resin be used as constituent materials of the extensible and contractible wiring lines 20a and 20b.

Examples of the conductive particles include metal powders such as silver, copper, and nickel. An average particle size of the conductive particles is preferably 0.01 µm to 10 µm. It is preferable that a shape of the conductive particles be spherical.

Examples of the resins include elastomer-based resins such as epoxy resins, urethane-based resins, acrylic-based resins, and silicone-based resins.

The constituent materials of the extensible and contractible wiring lines 20a and 20b may be the same or different.

Thicknesses of the extensible and contractible wiring lines 20a and 20b are preferably 100 µm or less, more preferably 50 µm or less. The thicknesses of the extensible and contractible wiring lines 20a and 20b are preferably 1 µm or more. The thicknesses of the extensible and contractible wiring lines 20a and 20b may be the same or different.

The electronic component 30 is electrically connected to the extensible and contractible wiring lines 20a and 20b. More specifically, the electronic component 30 is electrically connected to the extensible and contractible wiring lines 20a and 20b with connection portions 50a and 50b interposed therebetween. Examples of the connection portions 50a and 50b include solder, a conductive adhesive, and the like. The electronic component 30 may be directly connected to the extensible and contractible wiring lines 20a and 20b.

The electronic component 30 is roughly classified into an active component and a passive component. Examples of the active component include amplifiers (operational amplifiers, transistors, and the like), diodes, and the like. Examples of the passive component include capacitors, resistors, inductors, and the like.

The hard resin portion 40a is in contact with the extensible and contractible wiring lines 20a and 20b. More specifically, the hard resin portion 40a is in contact with sides of the extensible and contractible wiring line 20a and 20b opposite to the extensible and contractible substrate 10a and covers the electronic component 30. That is, the hard resin portion 40a functions as a sealing resin portion that protects the electronic component 30.

The hard resin portion 40a overlaps an end portion 60a of a connection region between the extensible and contractible wiring line 20a and the electronic component 30 in a plan view of the extensible and contractible mounting board. The hard resin portion 40a overlaps an end portion 60b of a connection region between the extensible and contractible wiring line 20b and the electronic component 30 in the plan view of the extensible and contractible mounting board. The hard resin portion 40a may overlap one of the end portion 60a of the connection region between the extensible and contractible wiring line 20a and the electronic component 30 and the end portion 60b of the connection region between the extensible and contractible wiring line 20b and the electronic component 30 in the plan view. That is, the hard resin portion 40a may overlap at least one of the end portion 60a of the connection region between the extensible and contractible wiring line 20a and the electronic component 30 and the end portion 60b of the connection region between the extensible and contractible wiring line 20b and the electronic component 30 in the plan view.

In the present specification, the connection regions between the extensible and contractible wiring lines and the electronic component are regions in the plan view in which the extensible and contractible wiring lines and the electronic component are substantially connected, and more specifically, means regions that are illustrated below. The end portions of the connection regions mean the end portions on a side farthest from the electronic component.

When the extensible and contractible wiring lines and the electronic component are connected with the connection portions such as solder interposed therebetween, the connection regions between the extensible and contractible wiring lines and the electronic component mean arrangement regions of the connection portions in the plan view. That is, as shown in FIG. 1, the end portion 60a of the connection region between the extensible and contractible wiring line 20a and the electronic component 30 corresponds to an end portion on a side farthest from the electronic component 30 in the arrangement region of the connection portion 50a. The end portion 60b of the connection region between the extensible and contractible wiring line 20b and the electronic component 30 corresponds to an end portion on a side farthest from the electronic component 30 in the arrangement region of the connection portion 50b. In this case, when the hard resin portion 40a overlaps at least one of the end portion on the side farthest from the electronic component 30 in the arrangement region of the connection portion 50a and the end portion on the side farthest from the electronic component 30 in the arrangement region of the connection portion 50b in the plan view, the hard resin portion is not limited to overlapping the electronic component 30 in the plan view.

On the other hand, when the extensible and contractible wiring lines and the electronic component are directly connected, the connection regions between the extensible and contractible wiring lines and the electronic component mean regions in which the extensible and contractible wiring lines and the electronic component overlap in the plan view.

The Young's modulus of the hard resin portion 40a is higher than the Young's modulus of the extensible and contractible substrate 10a.

Examples of a constituent material of the hard resin portion 40a includes at least one of polyvinyl chloride, polyethylene, polystyrene, polycarbonate, polyvinylidene fluoride, polyimide, liquid crystal polymer, polytetrafluoroethylene, and elastomer-based resin such as phenol resins, epoxy-based resins, urethane-based resin, acrylic-based resins, silicone-based resins, and styrene-butadiene-based resins.

Cutout portions 41a and 41b that overlap the extensible and contractible wiring lines 20a and 20b, respectively, in the plan view are provided in the hard resin portion 40a. The cutout portion 41a overlaps the extensible and contractible wiring line 20a in the plan view, and the cutout portion 41b overlaps the extensible and contractible wiring line 20b in the plan view. Only one of the cutout portion 41a or the cutout portion 41b may be provided.

In the present specification, the cutout portion means a portion having a shape in which both sides protrude and the inside thereof is concave. In FIG. 1, the concave cutout portions 41a and 41b are illustrated in the plan view.

The extensible and contractible mounting board 1a may have an electrode connected to at least one of the extensible and contractible wiring lines 20a and 20b at a position different from that of the electronic component 30. The extensible and contractible mounting board 1a can be used as a sensor by being attached to the living body with the electrode interposed therebetween.

It is preferable that the electrode be a gel electrode. The extensible and contractible mounting board 1a can be easily attached to the living body by using the gel electrode. The gel electrode is made of a conductive gel material containing, for example, water, alcohol, a moisturizer, an electrolyte, and the like. Examples of such a gel material include a hydrogel and the like.

In the extensible and contractible mounting board 1a, the electronic component 30 is less likely to extend and contract than the extensible and contractible wiring line 20a. Thus, when the extensible and contractible mounting board 1a extends and contracts (for example, when the extensible and contractible mounting board 1a is extended and contracted in an extension direction of the extensible and contractible wiring line 20a), in the connection region between the extensible and contractible wiring line 20a and the electronic component 30 (the arrangement region of the connection portion 50a in FIG. 1), though the extensible and contractible wiring line 20a extends and contracts, the electronic component 30 is less likely to extend and contract. Accordingly, a stress is likely to be concentrated on the extensible and contractible wiring line 20a in the vicinity of the end portion 60a of the connection region between the extensible and contractible wiring line 20a and the electronic component 30.

On the other hand, in the extensible and contractible mounting board 1a, the hard resin portion 40a overlaps the end portion 60a of the connection region between the extensible and contractible wiring line 20a and the electronic component 30 in the plan view. Thus, when the extensible and contractible mounting board 1a extends and contracts, the stress applied to the extensible and contractible wiring line 20a becomes small in the vicinity of the end portion 60a of the connection region between the extensible and contractible wiring line 20a and the electronic component 30.

This is because the hard resin portion 40a is less likely to extend and contract than the extensible and contractible wiring line 20a. Thus, when the extensible and contractible mounting board 1a extends and contracts, the hard resin portion 40a is less likely to extend and contract though the extensible and contractible wiring line 20a tries to extend and contract in a contact region between the extensible and contractible wiring line 20a and the hard resin portion 40a. Accordingly, a stress is likely to be concentrated on the extensible and contractible wiring line 20a in the vicinity of an end portion 80a of the contact region between the extensible and contractible wiring line 20a and the hard resin portion 40a.

Additionally, in the extensible and contractible mounting board 1a, the cutout portion 41a that overlaps the extensible and contractible wiring line 20a in the plan view is provided in the hard resin portion 40a. Accordingly, since the contact region between the extensible and contractible wiring line 20a and the hard resin portion 40a is narrowed, when the extensible and contractible mounting board 1a extends and contracts, the stress applied to the extensible and contractible wiring line 20a becomes small in the vicinity of the end portion 80a of the contact region between the extensible and contractible wiring line 20a and the hard resin portion 40a.

As the above result, the disconnection and a resistance increase of the extensible and contractible wiring line 20a when the extensible and contractible mounting board 1a extends and contracts are suppressed.

In the extensible and contractible mounting board 1a, the end portion 60a of the connection region between the extensible and contractible wiring line 20a and the electronic component 30 is covered with the hard resin portion 40a. Thus, when an external force (impact) is applied to the electronic component 30, the end portion 60a of the connection region between the extensible and contractible wiring line 20a and the electronic component 30 is protected.

The above effect is similarly exhibited for the end portion 60b of the connection region between the extensible and contractible wiring line 20b and the electronic component 30 and an end portion 80b of a contact region between the extensible and contractible wiring line 20b and the hard resin portion 40a.

In the extensible and contractible mounting board according to the present invention, it is preferable that a relationship of $0.45 \leq X/A < 1$ be satisfied when a depth of the cutout portion is X and a length of the hard resin portion protruding from the end portion of the connection region between the extensible and contractible wiring line and the electronic component is A in the same direction as X.

More specifically, as shown in FIG. 1, it is preferable that the relationship of $0.45 \leq X/A < 1$ be satisfied when the depth of the cutout portion 41a is X and the length of the hard resin portion 40a protruding from the end portion 60a of the connection region between the extensible and contractible wiring line 20a and the electronic component 30 is A in the same direction (in FIG. 1, horizontal direction: extension direction of the extensible and contractible wiring line 20a). When the cutout portion 41a is provided so as to satisfy such a relationship, an effect of reducing the stress applied to the extensible and contractible wiring line 20a is more remarkably exhibited when the extensible and contractible mounting board 1a extends and contracts. When $X/A \geq 1$, since the end portion 60a of the connection region between the extensible and contractible wiring line 20a and the electronic component 30 is exposed from the hard resin portion 40a, the stress is concentrated on the extensible and contractible wiring line 20a in the vicinity of the end portion 60a of the connection region between the extensible and contractible wiring line 20a and the electronic component 30 when the extensible and contractible mounting board 1a extends and contracts. Thus, it is necessary to satisfy $X/A < 1$. The above description is similarly established for the hard resin portion 40a and the cutout portion 41b.

In the extensible and contractible mounting board according to the present invention, it is preferable that a relationship of $0.2 \leq Y/B \leq 0.7$ be satisfied when a width of the cutout portion is Y and a width of the hard resin portion is B in the same direction as Y.

More specifically, as shown in FIG. 1, it is preferable that the relationship of $0.2 \leq Y/B \leq 0.7$ be satisfied when the width of the cutout portion 41a is Y and the width of the hard resin portion 40a is B in the same direction (in FIG. 1, vertical direction: direction orthogonal to the extension direction of the extensible and contractible wiring line 20a). When the cutout portion 41a is provided so as to satisfy such a relationship, an effect of reducing the stress applied to the extensible and contractible wiring line 20a is more remarkably exhibited when the extensible and contractible mounting board 1a extends and contracts. The above description is similarly established for the hard resin portion 40a and the cutout portion 41b.

In the extensible and contractible mounting board according to the present invention, it is preferable that a relationship of $0.5 \leq C/0.5Y \leq 1$ be satisfied when a corner portion the cutout portion proximal to the electronic component has an R shape with a radius C, and the width of the cutout portion is Y.

Figure 3:
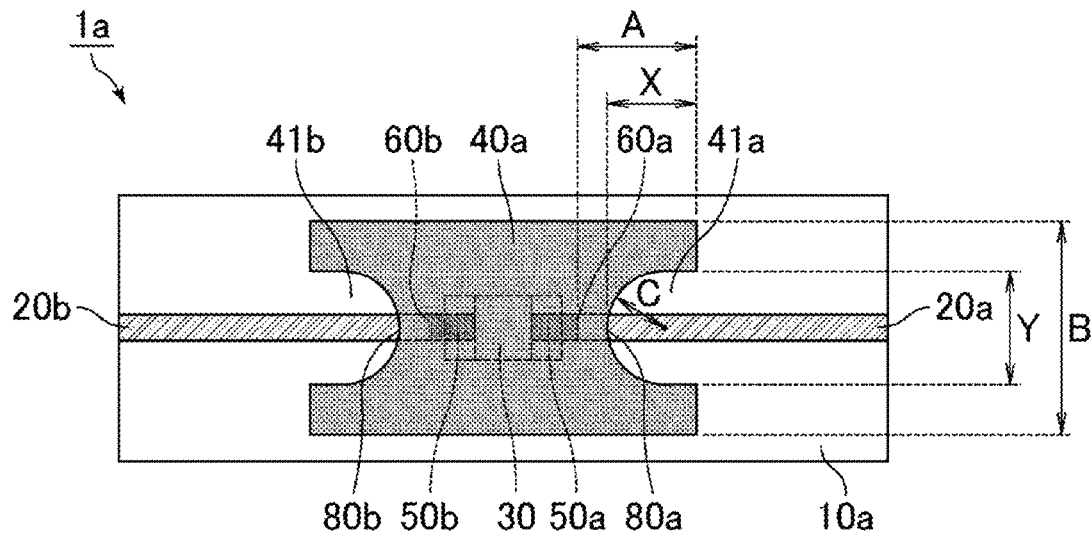
FIG. 3 is a schematic plan view illustrating a case where a cutout portion in FIG. 1 has an R shape.

FIG. 3 is a schematic plan view showing a case where the cutout portion in FIG. 1 has an R shape.

As shown in FIG. 3, it is preferable that the relationship of $0.5 \leq C/0.5Y \leq 1$ be satisfied when the corner portion of the cutout portion 41a proximal to the electronic component 30 has the R shape with the radius of C and the width of the cutout portion 41a is Y. When the cutout portion 41a is provided so as to satisfy such a relationship, an effect of reducing the stress applied to the extensible and contractible wiring line 20a is more remarkably exhibited when the extensible and contractible mounting board 1a extends and contracts. The above description is similarly established for the cutout portion 41b.

Modification Example 1 of Embodiment 1

In the extensible and contractible mounting board according to Embodiment 1 of the present invention, the number of extensible and contractible wiring lines may be three or more, and may radially extend from the electronic component in the plan view of the extensible and contractible mounting board. Such an example will be described as an extensible and contractible mounting board according to Modification Example 1 of Embodiment 1 of the present invention. The extensible and contractible mounting board according to Modification Example 1 of Embodiment 1 of the present invention is the same as the extensible and contractible mounting board according to Embodiment 1 of the present invention except for the number of extensible and contractible wiring lines.

Figure 4:
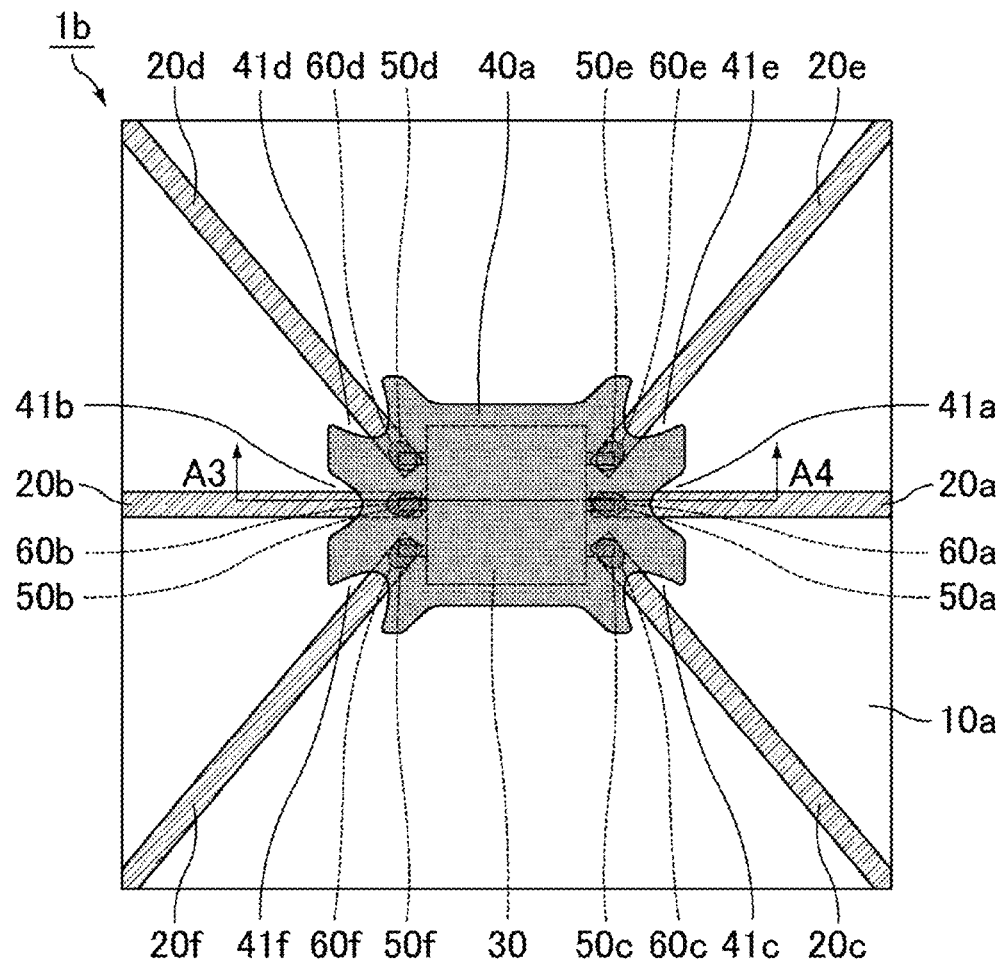
FIG. 4 is a schematic plan view illustrating an extensible and contractible mounting board according to Modification Example 1 of Embodiment 1 of the present invention.
Figure 5:
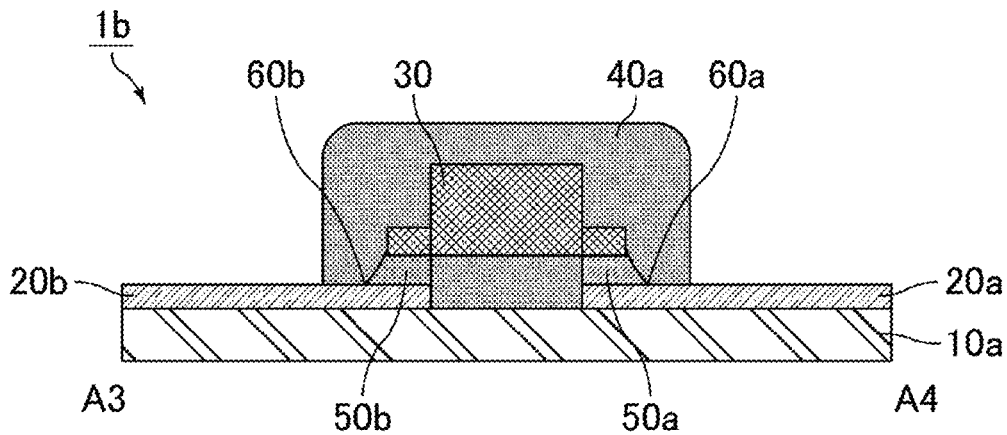
FIG. 5 is a schematic sectional view illustrating a portion corresponding to line segment A3-A4 in FIG. 4.

FIG. 4 is a schematic plan view showing the extensible and contractible mounting board according to Modification Example 1 of Embodiment 1 of the present invention. FIG. 5 is a schematic sectional view showing a portion corresponding to line segment A3-A4 in FIG. 4. As shown in FIGS. 4 and 5, an extensible and contractible mounting board 1b includes an extensible and contractible substrate 10a, extensible and contractible wiring lines 20a, 20b, 20c, 20d, 20e, and 20f, an electronic component 30, and a hard resin portion 40a.

The electronic component 30 is connected to the extensible and contractible wiring lines 20a, 20b, 20c, 20d, 20e, and 20f with connection portions 50a, 50b, 50c, 50d, 50e, and 50f interposed therebetween.

The hard resin portion 40a overlaps end portions 60a, 60b, 60c, 60d, 60e, and 60f of connection regions between the extensible and contractible wiring line 20a, 20b, 20c, 20d, 20e, and 20f and the electronic component 30 in the plan view.

Cutout portions 41a, 41b, 41c, 41d, 41e, and 41f that overlap the extensible and contractible wiring lines 20a, 20b, 20c, 20d, 20e, and 20f in the plan view are provided in the hard resin portion 40a.

The extensible and contractible wiring lines 20a, 20b, 20c, 20d, 20e, and 20f extend radially from the electronic component 30 in the plan view. As stated above, though there are three or more extensible and contractible wiring lines (six in FIG. 4), the disconnection and resistance increases of the extensible and contractible wiring lines 20a, 20b, 20c, 20d, 20e, and 20f when the extensible and contractible mounting board 1b extends and contracts are suppressed due to the action of the hard resin portion 40a (cutout portions 41a, 41b, 41c, 41d, 41e, and 41f). Though the extensible and contractible wiring lines 20a, 20b, 20c, 20d, 20e, and 20f are arranged at narrow pitches, dew condensation and ion migration in a high humidity environment are suppressed by the action of the hard resin portion 40a.

Modification Example 2 of Embodiment 1

In the extensible and contractible mounting board according to Embodiment 1 of the present invention, the extensible and contractible wiring line, the electronic component, and the hard resin portion may be covered with a soft resin portion having the Young's modulus lower than that of the hard resin portion. Such an example will be described as an extensible and contractible mounting board according to Modification Example 2 of Embodiment 1 of the present invention. The extensible and contractible mounting board according to Modification Example 2 of Embodiment 1 of the present invention is the same as the extensible and contractible mounting board according to Embodiment 1 of the present invention except that the soft resin portion is disposed.

Figure 6:
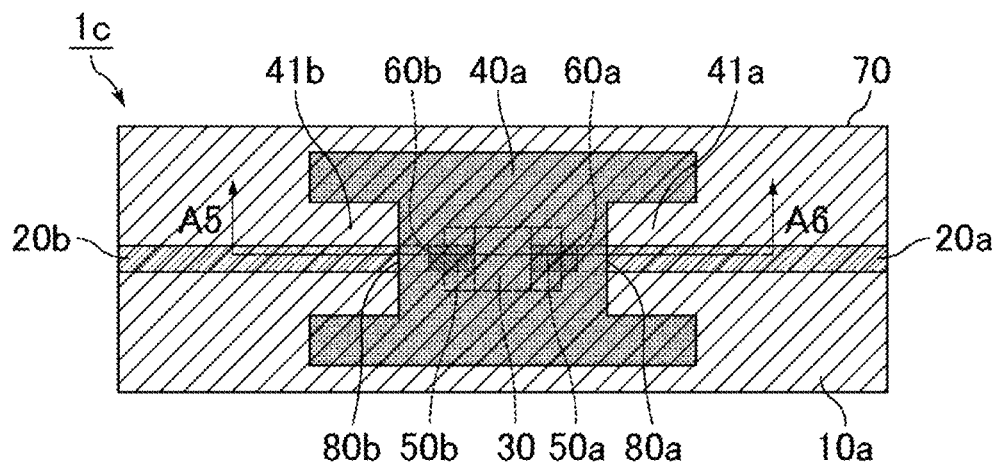
FIG. 6 is a schematic plan view illustrating an extensible and contractible mounting board according to Modification Example 2 of Embodiment 1 of the present invention.
Figure 7:
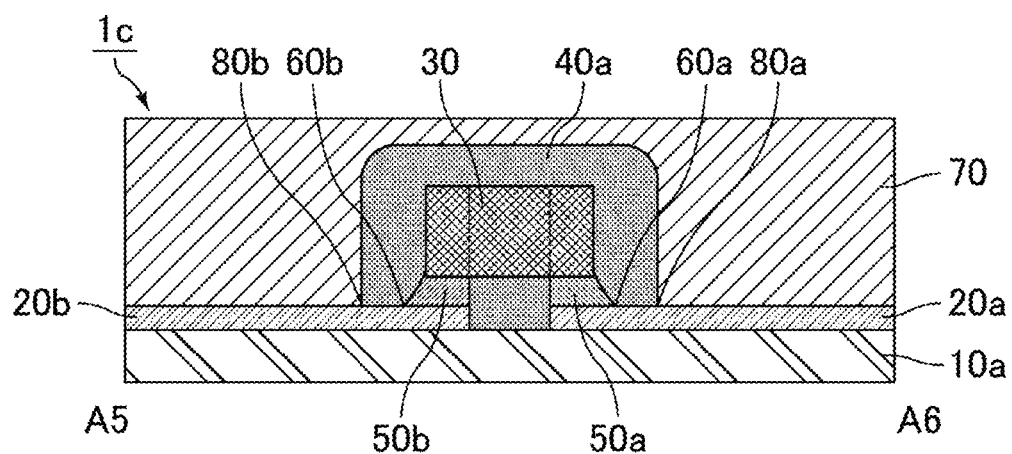
FIG. 7 is a schematic sectional view illustrating a portion corresponding to line segment A5-A6 in FIG. 6.

FIG. 6 is a schematic plan view showing the extensible and contractible mounting board according to Modification Example 2 of Embodiment 1 of the present invention. FIG. 7 is a schematic sectional view showing a portion corresponding to line segment A5-A6 in FIG. 6. As shown in FIGS. 6 and 7, an extensible and contractible mounting board 1c includes an extensible and contractible substrate 10a, extensible and contractible wiring lines 20a and 20b, an electronic component 30, a hard resin portion 40a, and a soft resin portion 70.

The Young's modulus of the soft resin portion 70 is lower than the Young's modulus of the hard resin portion 40a.

Examples of a constituent material of the soft resin portion 70 include resins such as elastomer-based resins such as silicone-based resins, acrylic-based resins, olefin-based resins, urethane-based resins, and styrene-butadiene-based resins.

The soft resin portion 70 covers the extensible and contractible wiring line 20a and the hard resin portion 40a, and as a result, also covers the electronic component 30. The extensible and contractible wiring line 20a, the electronic component 30, and the hard resin portion 40a are covered with the soft resin portion 70, and thus, a stress applied to the extensible and contractible wiring line 20a becomes smaller in the vicinity of an end portion 80a of a contact region between the extensible and contractible wiring line 20a and the hard resin portion 40a when the extensible and contractible mounting board 1c extends and contracts. Such an effect is similarly exhibited for the extensible and contractible wiring line 20b.

Modification Example 3 of Embodiment 1

In the extensible and contractible mounting board according to Embodiment 1 of the present invention, the extensible and contractible wiring line may have a first wiring line portion and a second wiring line portion, the first wiring line portion may be connected to the electronic component, and the second wiring line portion may overlap the cutout portion and may be wider than the first wiring line portion in the plan view. Such an example will be described as an extensible and contractible mounting board according to Modification Example 3 of Embodiment 1 of the present invention. The extensible and contractible mounting board according to Modification Example 3 of Embodiment 1 of the present invention is the same as the extensible and contractible mounting board according to Embodiment 1 of the present invention except for the shape of the extensible and contractible wiring line.

Figure 8:
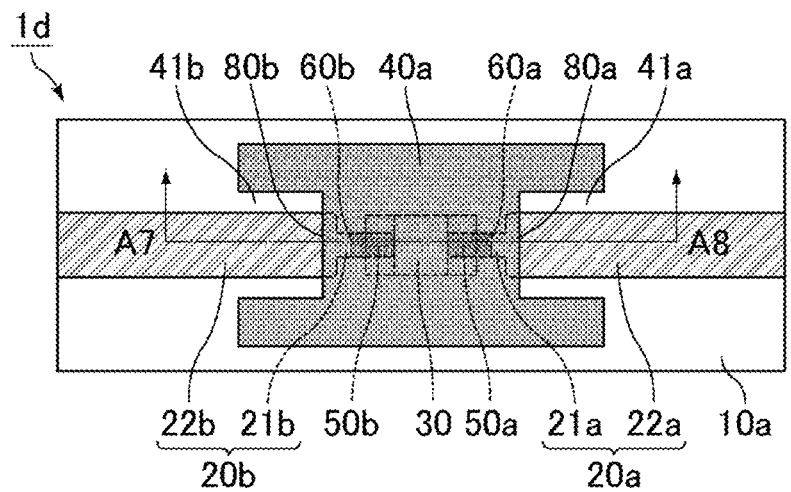
FIG. 8 is a schematic plan view illustrating an extensible and contractible mounting board according to Modification Example 3 of Embodiment 1 of the present invention.
Figure 9:
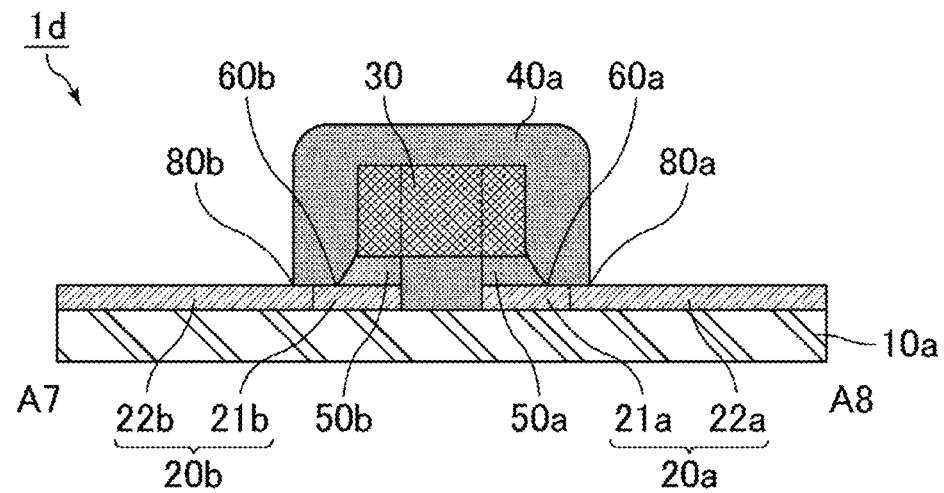
FIG. 9 is a schematic sectional view illustrating a portion corresponding to line segment A7-A8 in FIG. 8.

FIG. 8 is a schematic plan view showing the extensible and contractible mounting board according to Modification Example 3 of Embodiment 1 of the present invention. FIG. 9 is a schematic sectional view showing a portion corresponding to line segment A7-A8 in FIG. 8. As shown in FIGS. 8 and 9, an extensible and contractible mounting board 1d includes an extensible and contractible substrate 10a, extensible and contractible wiring lines 20a and 20b, an electronic component 30, and a hard resin portion 40a.

The extensible and contractible wiring line 20a has a first wiring line portion 21a and a second wiring line portion 22a. The first wiring line portion 21a is connected to the electronic component 30 with a connection portion 50a interposed therebetween. The second wiring line portion 22a overlaps a cutout portion 41a in the plan view and is wider than the first wiring line portion 21a in the plan view.

The extensible and contractible wiring line 20b has a first wiring line portion 21b and a second wiring line portion 22b. The first wiring line portion 21b is connected to the electronic component 30 with a connection portion 50b interposed therebetween. The second wiring line portion 22b overlaps the cutout portion 41b in the plan view and is wider than the first wiring line portion 21b in the plan view.

In the extensible and contractible wiring line 20a, since the second wiring line portion 22a that overlaps the cutout portion 41a in the plan view is wide, a stress applied to the extensible and contractible wiring line 20a becomes smaller when the extensible and contractible mounting board 1d extends and contracts. Such an effect is similarly exhibited for the extensible and contractible wiring line 20b.

Embodiment 2

In the extensible and contractible mounting board according to the present invention, the cutout portion may overlap the extensible and contractible wiring line in the plan view. In the extensible and contractible mounting board according to the present invention, the hard resin portion may be in contact with sides of the extensible and contractible wiring lines proximal to the extensible and contractible substrate and may be in contact with the extensible and contractible substrate. Such an example will be described as an extensible and contractible mounting board according to Embodiment 2 of the present invention. The extensible and contractible mounting board according to Embodiment 2 of the present invention is the same as the extensible and contractible mounting board according to Embodiment 1 of the present invention except for the position of the hard resin portion.

Figure 10:
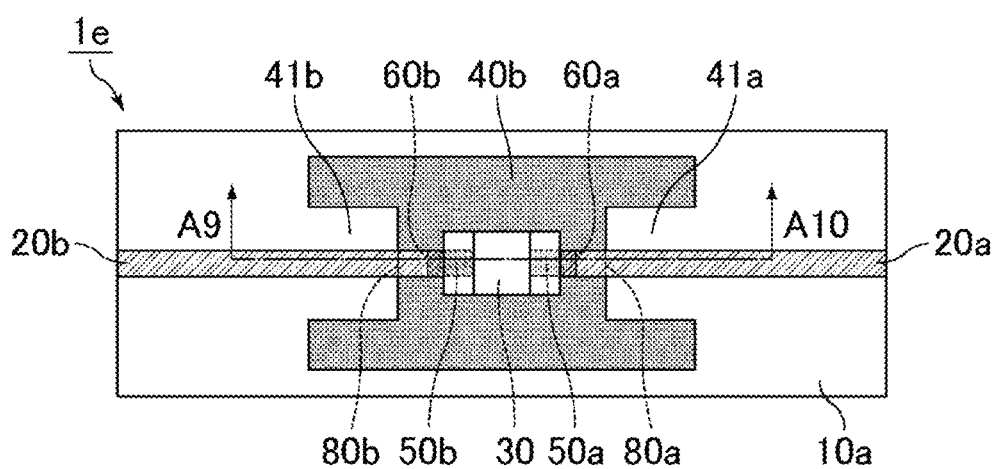
FIG. 10 is a schematic plan view illustrating an extensible and contractible mounting board according to Embodiment 2 of the present invention.

FIG. 10 is a schematic plan view showing the extensible and contractible mounting board according to Embodiment 2 of the present invention.

Figure 11:
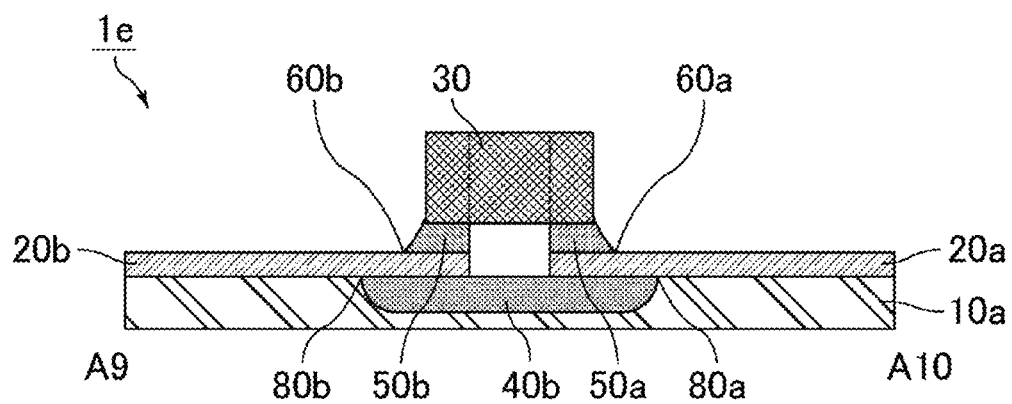
FIG. 11 is a schematic sectional view illustrating a portion corresponding to line segment A9-A10 in FIG. 10.

FIG. 11 is a schematic sectional view showing a portion corresponding to line segment A9-A10 in FIG. 10. As shown in FIGS. 10 and 11, an extensible and contractible mounting board 1e includes an extensible and contractible substrate 10a, extensible and contractible wiring lines 20a and 20b, an electronic component 30, and a hard resin portion 40b.

The Young's modulus of the hard resin portion 40b is higher than the Young's modulus of the extensible and contractible substrate 10a.

The hard resin portion 40b is in contact with sides of the extensible and contractible wiring line 20a and 20b proximal to the extensible and contractible substrate 10a, and is in contact with the extensible and contractible substrate 10a. More specifically, the hard resin portion 40b is present at a position so as to be embedded in the extensible and contractible substrate 10a.

The hard resin portion 40b is formed by using, for example, the method described in Japanese Patent Application Laid-Open No. 2017-110217. More specifically, the hard resin portion 40b is formed by selectively irradiating the extensible and contractible substrate 10a with active energy rays so as to increase a part of a degree of cross-linking.

The hard resin portion 40b overlaps an end portion 60a of a connection region between the extensible and contractible wiring line 20a and the electronic component 30 (arrangement region of a connection portion 50a in FIG. 10) in the plan view.

Thus, a stress applied to the extensible and contractible wiring line 20a becomes small in the vicinity of the end portion 60a of the connection region between the extensible and contractible wiring line 20a and the electronic component 30 when the extensible and contractible mounting board 1e extends and contracts. A cutout portion 41a that overlaps the extensible and contractible wiring line 20a in the plan view is provided in the hard resin portion 40b. Accordingly, since a contact region between the extensible and contractible wiring line 20a and the hard resin portion 40b is narrowed, the stress applied to the extensible and contractible wiring line 20a becomes small in the vicinity of an end portion 80a of a contact region between the extensible and contractible wiring line 20a and the hard resin portion 40b when the extensible and contractible mounting board 1e extends and contracts. As a result, the disconnection and a resistance increase of the extensible and contractible wiring line 20a when the extensible and contractible mounting board 1e extends and contracts are suppressed. Such an effect is similarly exhibited for the extensible and contractible wiring line 20b.

Modification Example 1 of Embodiment 2

In the extensible and contractible mounting board according to Embodiment 2 of the present invention, the end portion of the connection region between the extensible and contractible wiring line and the electronic component may be covered with another hard resin portion having the Young's modulus higher than that of the extensible and contractible substrate. Such an example will be described as an extensible and contractible mounting board according to Modification Example 1 of Embodiment 2 of the present invention. The extensible and contractible mounting board according to Modification Example 1 of Embodiment 2 of the present invention is the same as the extensible and contractible mounting board according to Embodiment 2 of the present invention except that the end portion of the connection region between the extensible and contractible wiring line and the electronic component is covered with another hard resin portion.

Figure 12:
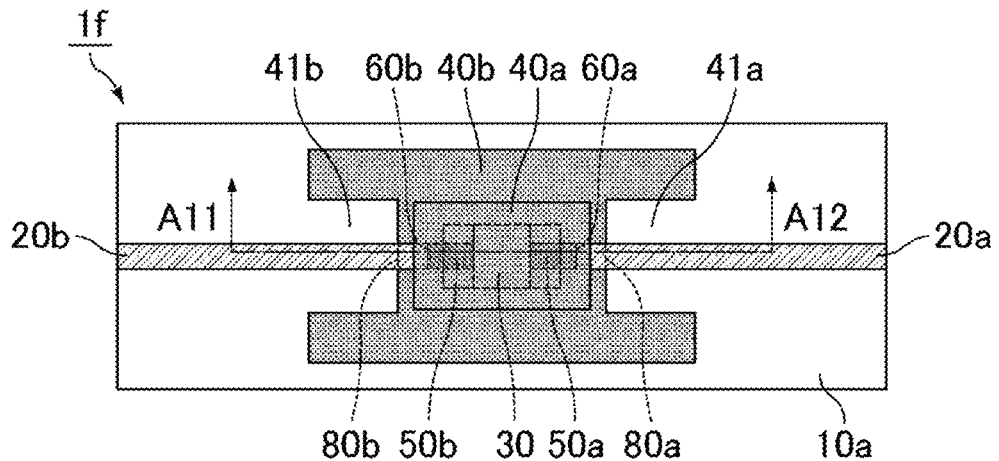
FIG. 12 is a schematic plan view illustrating an extensible and contractible mounting board according to Modification Example 1 of Embodiment 2 of the present invention.
Figure 13:
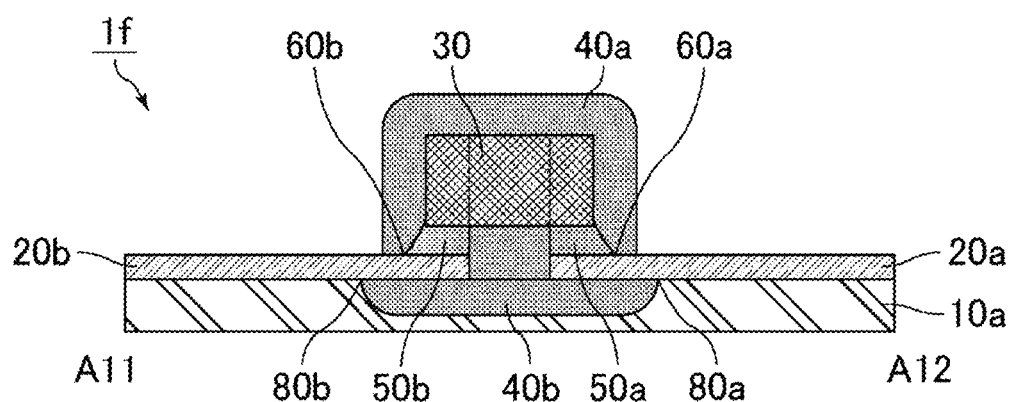
FIG. 13 is a schematic sectional view illustrating a portion corresponding to line segment A11-Al2 in FIG. 12.

FIG. 12 is a schematic plan view showing the extensible and contractible mounting board according to Modification Example 1 of Embodiment 2 of the present invention. FIG. 13 is a schematic sectional view showing a portion corresponding to line segment A11-A12 in FIG. 12. As shown in FIGS. 12 and 13, an extensible and contractible mounting board if includes an extensible and contractible substrate 10a, extensible and contractible wiring lines 20a and 20b, an electronic component 30, and hard resin portions 40a and 40b.

A cutout portion may be provided in the hard resin portion 40a as in Embodiment 1. It is also possible not to provide a cutout portion in the hard resin portion 40a.

An end portion 60a of the connection region between the extensible and contractible wiring line 20a and the electronic component 30 is covered with the hard resin portion 40a. Thus, when an external force (impact) is applied to the electronic component 30, the end portion 60a of the connection region between the extensible and contractible wiring line 20a and the electronic component 30 is protected. Such an effect is similarly exhibited for the end portion 60b of the connection region between the extensible and contractible wiring line 20b and the electronic component 30.

Modification Example 2 of Embodiment 2

In the extensible and contractible mounting board according to Embodiment 2 of the present invention, the hard resin portion may be an insulating portion that is not present at a position so as to be embedded in the extensible and contractible substrate and is disposed between the extensible and contractible substrate and the extensible and contractible wiring line. Such an example will be described as an extensible and contractible mounting board according to Modification Example 2 of Embodiment 2 of the present invention. The extensible and contractible mounting board according to Modification Example 2 of Embodiment 2 of the present invention is the same as the extensible and contractible mounting board according to Embodiment 2 of the present invention except for the position of the hard resin portion.

Figure 14:
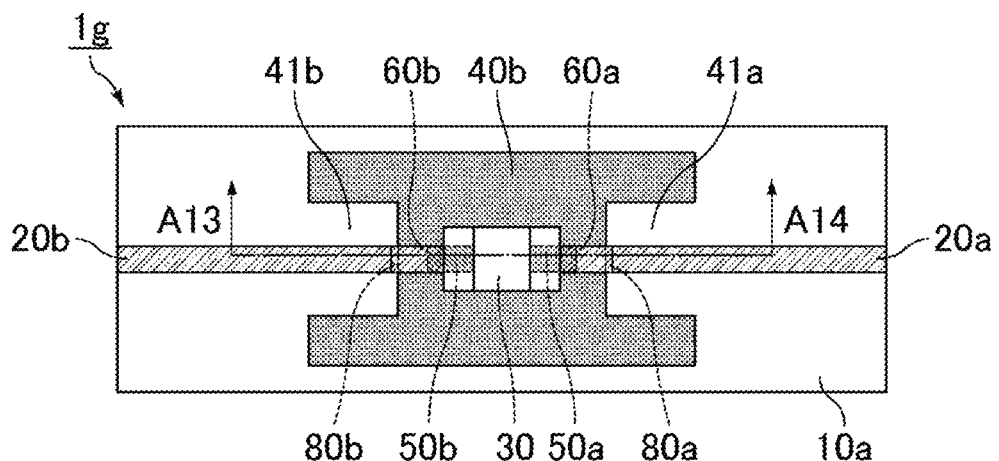
FIG. 14 is a schematic plan view illustrating an extensible and contractible mounting board according to Modification Example 2 of Embodiment 2 of the present invention.
Figure 15:
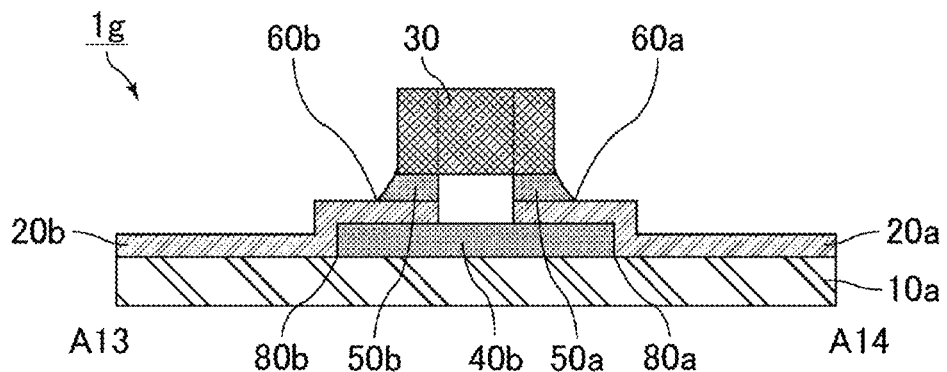
FIG. 15 is a schematic sectional view illustrating a portion corresponding to line segment A13-A14 in FIG. 14.

FIG. 14 is a schematic plan view showing the extensible and contractible mounting board according to Modification Example 2 of Embodiment 2 of the present invention. FIG. 15 is a schematic sectional view showing a portion corresponding to line segment A13-A14 in FIG. 14. As shown in FIGS. 14 and 15, an extensible and contractible mounting board 1g has an extensible and contractible substrate 10a, extensible and contractible wiring lines 20a and 20b, an electronic component 30, and a hard resin portion 40b.

The hard resin portion 40b is an insulating portion that is not present at a position so as to be embedded in the extensible and contractible substrate 10a and is disposed between the extensible and contractible substrate 10a and the extensible and contractible wiring lines 20a and 20b.

When the hard resin portion 40b functions as the insulating portion, examples of a constituent material thereof include elastomer-based resins such as urethane-based, styrene-based, olefin-based, silicone-based, fluorine-based, nitrile rubber, latex rubber, vinyl chloride, ester-based, and amide-based, epoxy, phenol, acrylic, polyester, imide-based, rosin, cellulose, polyethylene terephthalate-based, polyethylene naphthalate-based, polycarbonate-based resins, and the like.

Embodiment 3

In the extensible and contractible mounting board according to the present invention, the cutout portion may overlap the extensible and contractible wiring line in section view. In the extensible and contractible mounting board according to the present invention, the hard resin portion has the first resin portion and the second resin portion, the first resin portion may be in contact with the side of the extensible and contractible wiring line proximal to the extensible and contractible substrate and may be in contact with the extensible and contractible substrate, and the second resin portion may be in contact with the side of the extensible and contractible wiring line opposite to the extensible and contractible substrate and may cover the electronic component. Such an example will be described as an extensible and contractible mounting board according to Embodiment 3 of the present invention. The extensible and contractible mounting board according to Embodiment 3 of the present invention is the same as the extensible and contractible mounting board according to Embodiment 1 of the present invention except for the position of the hard resin portion.

Figure 16:
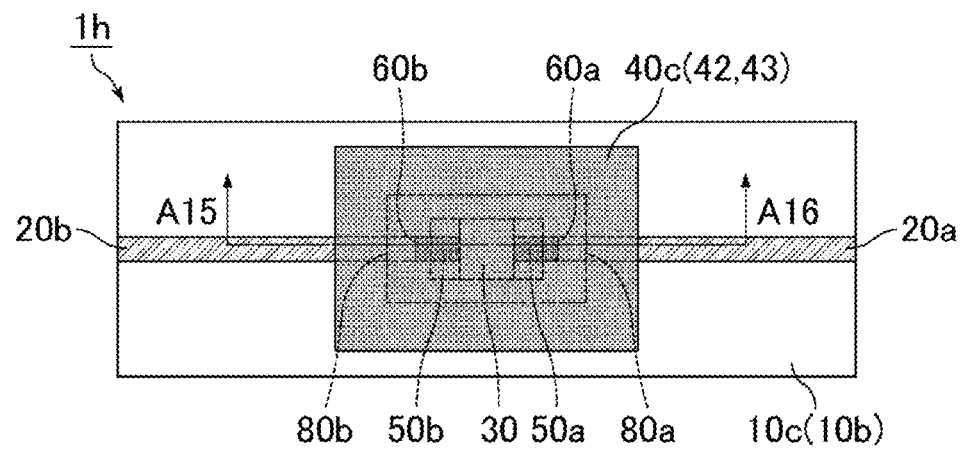
FIG. 16 is a schematic plan view illustrating an extensible and contractible mounting board according to Embodiment 3 of the present invention.

FIG. 16 is a schematic plan view showing the extensible and contractible mounting board according to Embodiment 3 of the present invention.

Figure 17:
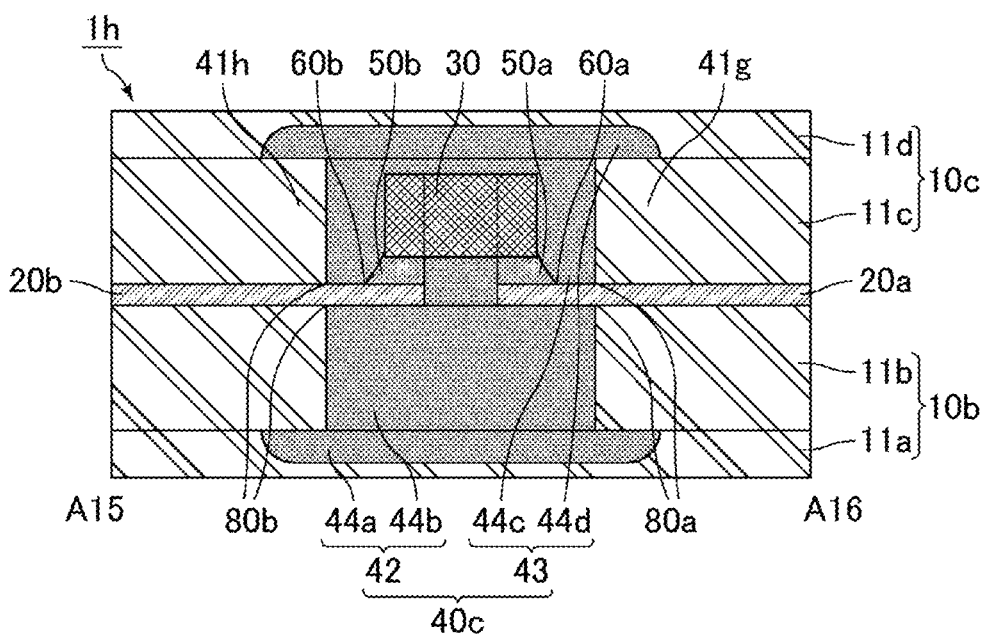
FIG. 17 is a schematic sectional view illustrating a portion corresponding to line segment A15-A16 in FIG. 16.

FIG. 17 is a schematic sectional view showing a portion corresponding to line segment A15-A16 in FIG. 16. As shown in FIGS. 16 and 17, an extensible and contractible mounting board 1h includes extensible and contractible substrates 10b and 10c, extensible and contractible wiring lines 20a and 20b, an electronic component 30, and a hard resin portion 40c.

The extensible and contractible substrate 10b has substrate layers 11a and 11b.

The extensible and contractible substrate 10c has substrate layers 11c and 11d.

The hard resin portion 40c has a first resin portion 42 and a second resin portion 43.

The first resin portion 42 has resin layers 44a and 44b. The Young's modulus of the resin layer 44a is higher than the Young's modulus of the substrate layer 11a. The Young's modulus of the resin layer 44b is higher than the Young's modulus of the substrate layer 11b.

The first resin portion 42 is in contact with sides of the extensible and contractible wiring line 20a and 20b proximal to the extensible and contractible substrate 10b, and is in contact with the extensible and contractible substrate 10b. More specifically, the first resin portion 42 is present at a position so as to be embedded in the extensible and contractible substrate 10b.

The resin layer 44a is present at a position so as to be embedded in the substrate layer 11a, and the resin layer 44b is present at a position so as to be embedded in the substrate layer 11b.

The first resin portion 42 is formed, for example, as follows. First, the resin layer 44a is formed by selectively irradiating the substrate layer 11a with active energy rays so as to increase a part of a degree of cross-linking. The substrate layer 11b is disposed on one main surface obtained by integrating the substrate layer 11a and the resin layer 44a. Thereafter, the resin layer 44b is formed by selectively irradiating the substrate layer 11b with active energy rays so as to increase a part of a degree of cross-linking. As a result, the first resin portion 42 including the resin layers 44a and 44b is formed. Examples of the above-mentioned irradiation method of the active energy rays include the method described in Japanese Patent Application Laid-Open No. 2017-110217.

The second resin portion 43 has resin layers 44c and 44d. The Young's modulus of the resin layer 44c is higher than the Young's modulus of the substrate layer 11c. The Young's modulus of the resin layer 44d is higher than the Young's modulus of the substrate layer 11d.

The second resin portion 43 is in contact with sides of the extensible and contractible wiring lines 20a and 20b opposite to the extensible and contractible substrate 10b, and covers the electronic component 30. The second resin portion 43 is in contact with sides of the extensible and contractible wiring lines 20a and 20b proximal to the extensible and contractible substrate 10c, and is in contact with the extensible and contractible substrate 10c. More specifically, the second resin portion 43 is present at a position so as to be embedded in the extensible and contractible substrate 10c. The resin layer 44c is present at a position so as to be embedded in the substrate layer 11c, and the resin layer 44d is present at a position so as to be embedded in the substrate layer 11d.

The second resin portion 43 is formed, for example, as follows. First, the extensible and contractible wiring lines 20a and 20b, the electronic component 30, and the substrate layer 11c are arranged on one main surface obtained by integrating the extensible and contractible substrate 10b and the first resin portion 42 which are obtained by the above method. The resin layer 44c is formed by selectively irradiating the substrate layer 11c with active energy rays so as to increase a part of a degree of cross-linking. The substrate layer 11d is disposed on one main surface obtained by integrating the substrate layer 11c and the resin layer 44c. Thereafter, the resin layer 44d is formed by selectively irradiating the substrate layer 11d with active energy rays so as to increase a part of the degree of cross-linking. As a result, the second resin portion 43 including the resin layers 44c and 44d is formed. Examples of the above-mentioned irradiation method of the active energy rays include the method described in Japanese Patent Application Laid-Open No. 2017-110217.

Cutout portions 41g and 41h that overlap the extensible and contractible wiring lines 20a and 20b in section view are provided in the hard resin portion 40c.

The cutout portion 41g may overlap the extensible and contractible wiring line 20a in section view, whereas the cutout portion 41h is not limited to overlapping the extensible and contractible wiring line 20b in section view. The cutout portion 41h overlaps the extensible and contractible wiring line 20b in section view, whereas the cutout portion 41g is not limited to overlapping the extensible and contractible wiring line 20a in section view.

The hard resin portion 40c (first resin portion 42 and second resin portion 43) overlaps the end portion 60a of the connection region between the extensible and contractible wiring line 20a and the electronic component 30 (arrangement region of the connection portion 50a in FIG. 16) in the plan view. Thus, a stress applied to the extensible and contractible wiring line 20a becomes small in the vicinity of the end portion 60a of the connection region between the extensible and contractible wiring line 20a and the electronic component 30 when the extensible and contractible mounting board 1h extends and contracts. The cutout portion 41g that overlaps the extensible and contractible wiring line 20a in section view is provided in the hard resin portion 40c. Accordingly, since the contact region between the extensible and contractible wiring line 20a and the hard resin portion 40c is narrowed, the stress applied to the extensible and contractible wiring line 20a becomes smaller in the vicinity of the end portion 80a of the contact region between the extensible and contractible wiring line 20a and the hard resin portion 40c when the extensible and contractible mounting board 1h extends and contracts. As a result, the disconnection and a resistance increase of the extensible and contractible wiring line 20a when the extensible and contractible mounting board 1h extends and contracts are suppressed. Such an effect is similarly exhibited for the extensible and contractible wiring line 20b.

The end portion 60a of the connection region between the extensible and contractible wiring line 20a and the electronic component 30 is covered with the second resin portion 43 of the hard resin portion 40c. Thus, when an external force (impact) is applied to the electronic component 30, the end portion 60a of the connection region between the extensible and contractible wiring line 20a and the electronic component 30 is protected. Such an effect is similarly exhibited for the end portion 60b of the connection region between the extensible and contractible wiring line 20b and the electronic component 30.

EXAMPLES

Hereinafter, examples in which the extensible and contractible mounting board according to the present invention is disclosed more specifically will be illustrated. The present invention is not limited to these examples.

Example 1

Figure 18:
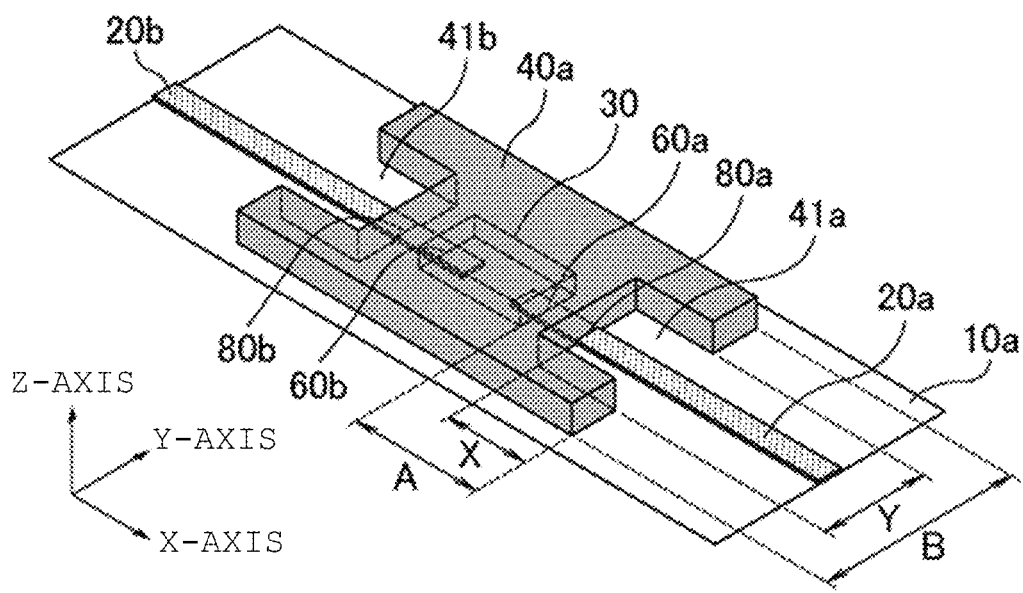
FIG. 18 is a schematic perspective view illustrating an extensible and contractible mounting board according to Example 1.

FIG. 18 is a schematic perspective view showing an extensible and contractible mounting board according to Example 1. As shown in FIG. 18, the extensible and contractible mounting board according to Example 1 corresponds to the extensible and contractible mounting board according to Embodiment 1.

Example 2

Figure 19:
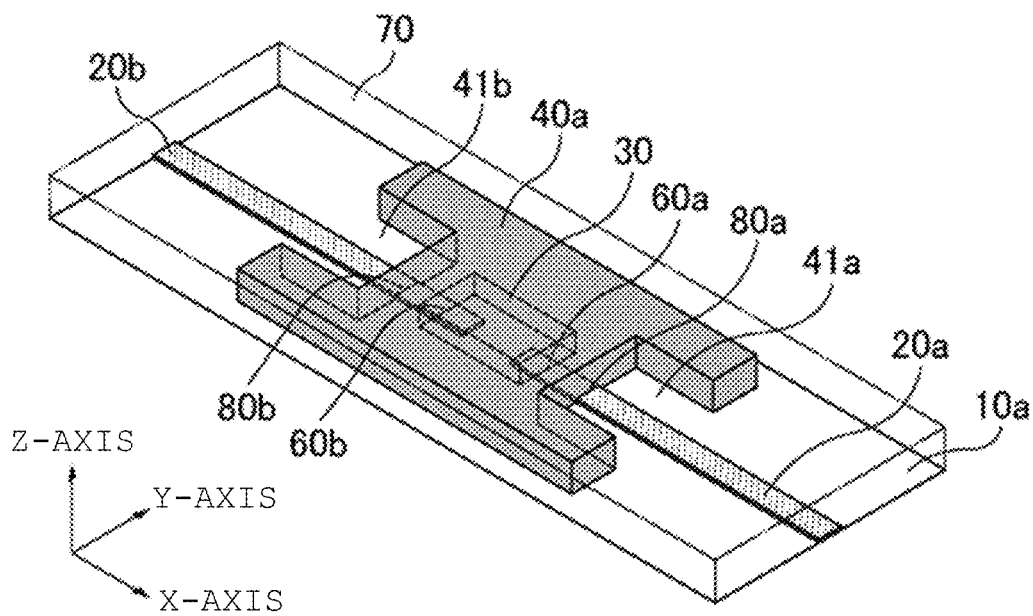
FIG. 19 is a schematic perspective view illustrating an extensible and contractible mounting board according to Example 2.

FIG. 19 is a schematic perspective view showing an extensible and contractible mounting board according to Example 2. As shown in FIG. 19, the extensible and contractible mounting board according to Example 2 corresponds to the extensible and contractible mounting board according to Modification Example 2 of Embodiment 1.

Comparative Example 1

Figure 20:
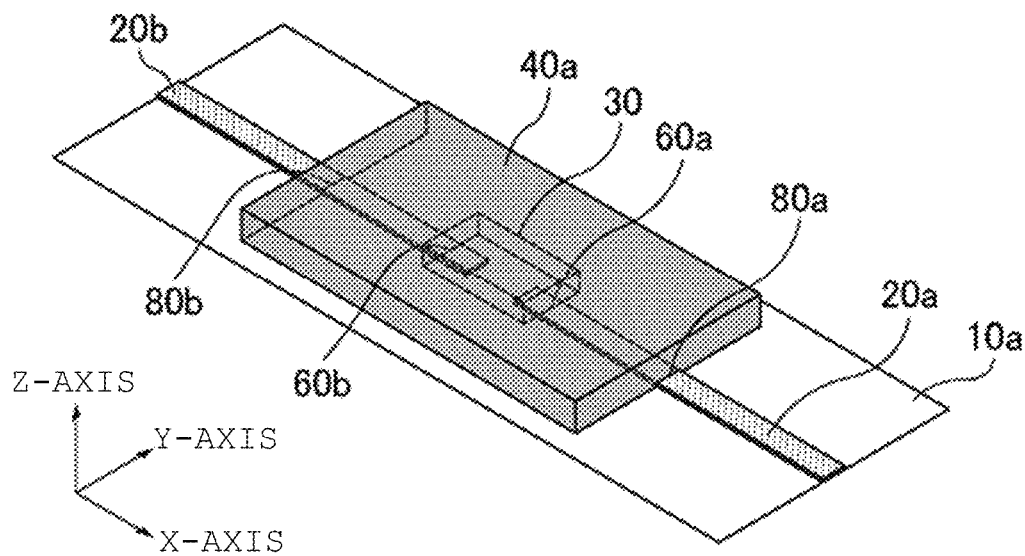
FIG. 20 is a schematic perspective view illustrating an extensible and contractible mounting board according to Comparative Example 1.

FIG. 20 is a schematic perspective view showing an extensible and contractible mounting board according to Comparative Example 1. As shown in FIG. 20, the extensible and contractible mounting board according to Comparative Example 1 is the same as the extensible and contractible mounting board according to Example 1 except that the cutout portions 41a and 41b are not provided in the hard resin portion 40a.

Comparative Example 2

Figure 21:
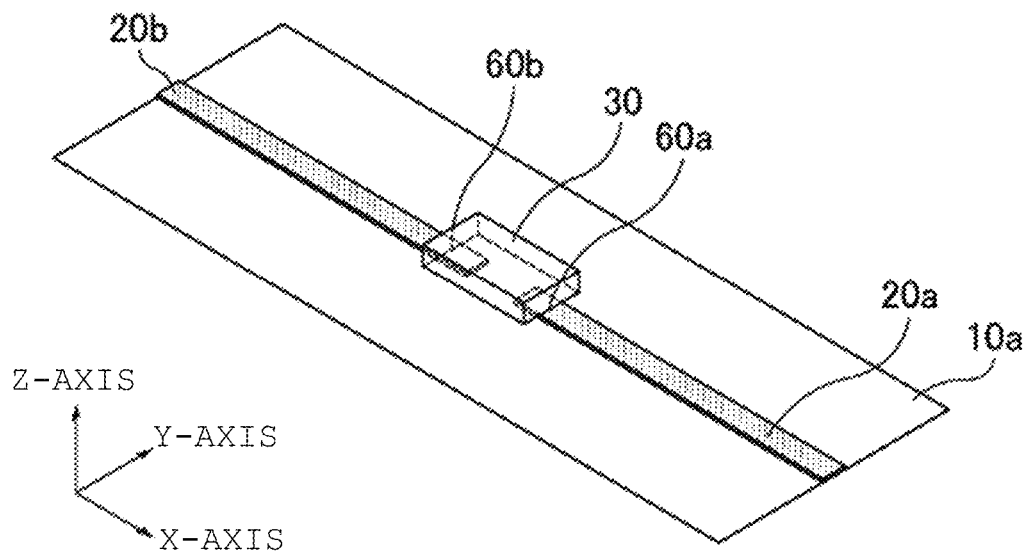
FIG. 21 is a schematic perspective view illustrating an extensible and contractible mounting board according to Comparative Example 2.

FIG. 21 is a schematic perspective view showing an extensible and contractible mounting board according to Comparative Example 2. As shown in FIG. 21, the extensible and contractible mounting board according to Comparative Example 2 is the same as the extensible and contractible mounting board according to Example 1 except that the hard resin portion 40a is not disposed.

Evaluation 1

A stress applied to the extensible and contractible wiring lines 20a and 20b when the extensible and contractible mounting boards according to Example 1, Comparative Example 1, and Comparative Example 2 were extended by 7% in an X-axis direction (extension direction of the extensible and contractible wiring lines 20a and 20b) was simulated by using the finite element method (FEM). Simulation conditions were set as follows. An evaluation point of the stress was set at a center of a YZ plane of the extensible and contractible wiring lines 20a and 20b.

Figure 22:
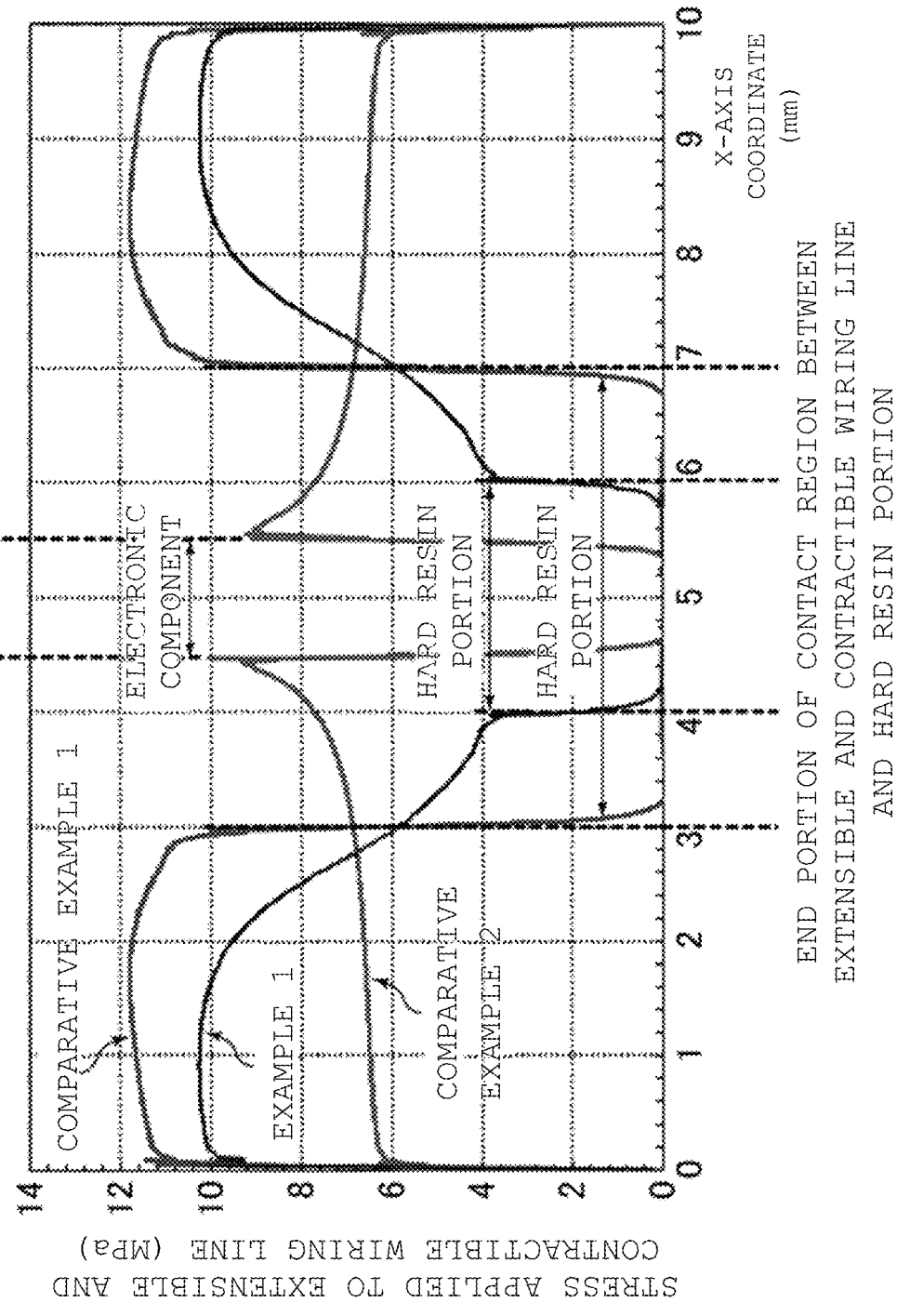
FIG. 22 is a graph illustrating simulation results of a stress applied to an extensible and contractible wiring line when the extensible and contractible mounting boards according to Example 1, Comparative Example 1, and Comparative Example 2 extend.

(Extensible and contractible substrate 10a)
length in X-axis direction: 10 mm
length in Y-axis direction: 4 mm
length in Z-axis direction: 0.04 mm
Young's modulus: 9.9 MPa
Poisson's ratio: 0.48
mesh condition: 0.2 mm
(Extensible and contractible wiring lines 20a and 20b)
length in X-axis direction: 4.75 mm
length in Y-axis direction: 0.2 mm
length in Z-axis direction: 0.025 mm
Young's modulus: 73.6 MPa
Poisson's ratio: 0.48
mesh condition: 0.025 mm
(Electronic component 30)
length in X-axis direction: 1 mm
length in Y-axis direction: 0.5 mm
length in Z-axis direction: 0.2 mm
Young's modulus: 73.2 GPa
Poisson's ratio: 0.38
mesh condition: 0.2 mm
(Hard resin portion 40a)
length in X-axis direction: 4 mm
length in Y-axis direction: 2 mm
length in Z-axis direction: 0.25 mm
Young's modulus: 3.44 GPa
Poisson's ratio: 0.41
mesh condition: 0.5 mm
(Cutout portions 41a and 41b)
length in X-axis direction: 1 mm
length in Y-axis direction: 1 mm
length in Z-axis direction: 0.25 mm FIG. 22 is a graph showing simulation results of a stress applied to the extensible and contractible wiring line when the extensible and contractible mounting boards according to Example 1, Comparative Example 1, and Comparative Example 2 extend. A horizontal axis in FIG. 22 represents an X-axis coordinate (unit: mm) when an origin is an end portion of the extensible and contractible wiring line 20b opposite to the electronic component 30. As shown in FIG. 22, the stress applied to the extensible and contractible wiring line 20a was smaller in the vicinity of the end portion 60a of the connection region between the extensible and contractible wiring line 20a and the electronic component 30 in Example 1 than in Comparative Example 2. Accordingly, an effect of reducing the stress by disposing the hard resin portion 40a was confirmed. Further, in Example 1, the stress applied to the extensible and contractible wiring line 20a was smaller in the vicinity of the end portion 80a of the contact region between the extensible and contractible wiring line 20a and the hard resin portion 40a than in Comparative Example 1. Accordingly, an effect of reducing the stress by providing the cutout portion 41a in the hard resin portion 40a was also confirmed. The above effect of reducing the stress was also confirmed for the extensible and contractible wiring line 20b.

Evaluation 2

The extensible and contractible mounting boards according to Example 1, Comparative Example 1, and Comparative Example 2 were actually produced, and a resistance of the extensible and contractible wiring line 20a and a change rate thereof were measured while changing an extension rate.

Figure 23:
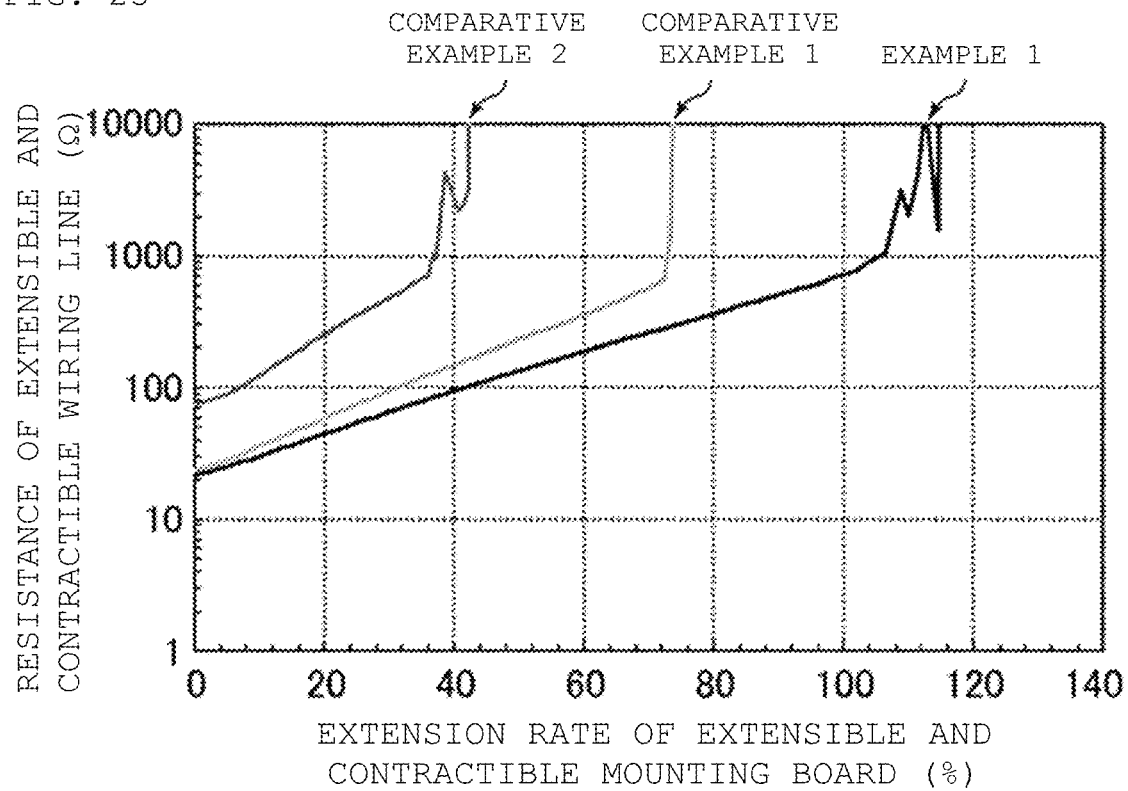
FIG. 23 is a graph illustrating a relationship between an extension ratio of the extensible and contractible mounting boards according to Example 1, Comparative Example 1, and Comparative Example 2 and a resistance of the extensible and contractible mounting board.
Figure 24:
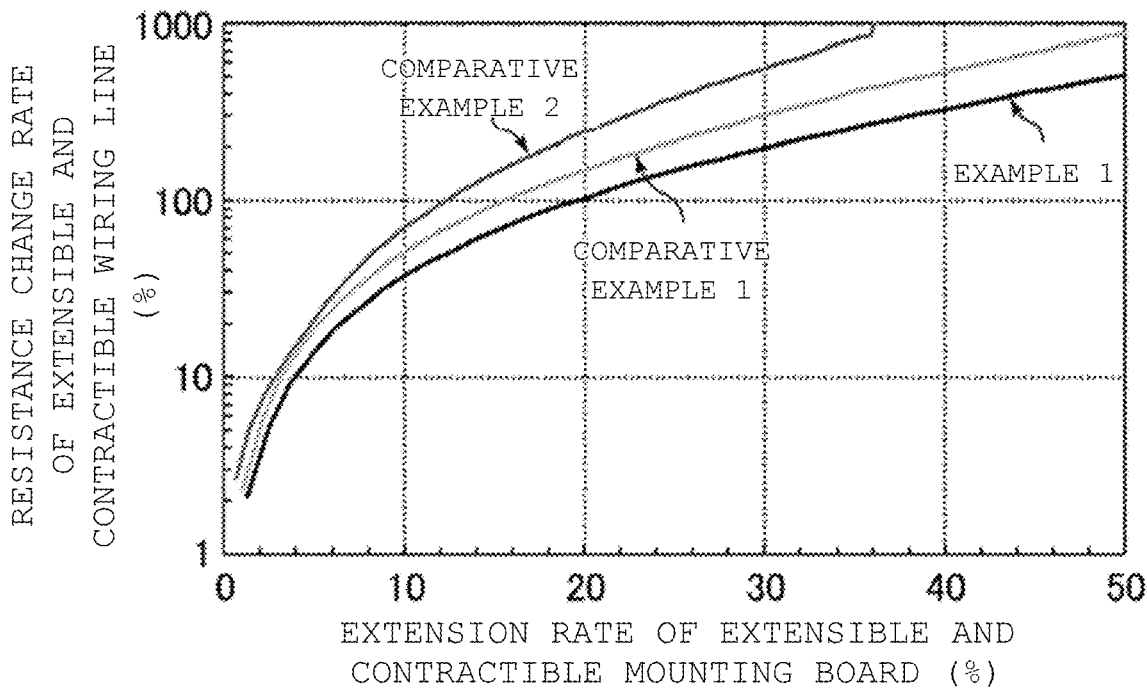
FIG. 24 is a graph illustrating a relationship between an extension ratio of the extensible and contractible mounting boards according to Example 1, Comparative Example 1, and Comparative Example 2 and a percentage change in resistance of the extensible and contractible wiring line of the extensible and contractible mounting boards.

The following members were used as the members of the extensible and contractible mounting board.

extensible and contractible substrate 10a: thermoplastic polyurethane
extensible and contractible wiring lines 20a and 20b: mixture of silver and copolymer resin
electronic component 30: rectangular chip resistors
hard resin portion 40a: acrylic resin FIG. 23 is a graph illustrating a relationship between an extension ratio of the extensible and contractible mounting boards according to Example 1, Comparative Example 1, and Comparative Example 2 and the resistance of the extensible and contractible wiring line of the extensible and contractible mounting boards. FIG. 24 is a graph illustrating a relationship between an extension ratio of the extensible and contractible mounting boards according to Example 1, Comparative Example 1, and Comparative Example 2 and a percentage change in resistance of the extensible and contractible wiring line of the extensible and contractible mounting boards. The "percentage change in resistance of extensible and contractible wiring line" (unit: %) represented on a vertical axis in FIG. 24 is defined as $100\times(R1-R2)/R2$ where the resistance of the extensible and contractible wiring line when the extension rate of the extensible and contractible mounting board has a certain value is R1 (unit: Ω) and the resistance of the extensible and contractible wiring line when the extension rate of the extensible and contractible mounting board is 0% is R2 (unit: Ω). As shown in FIGS. 23 and 24, a resistance increase of the extensible and contractible wiring line 20a due to the extension of the extensible and contractible mounting board was further suppressed in Example 1 as compared with Comparative Examples 1 and 2. Although it is considered that a case where the resistance of the extensible and contractible wiring line 20a started to rise sharply in FIG. 23 indicates that the extensible and contractible wiring line 20a started to be disconnected, the disconnection of the extensible and contractible wiring line 20a when the extension of the extensible and contractible mounting board extends was further suppressed in Example 1 as compared with Comparative Examples 1 and 2. The above results were also confirmed for the extensible and contractible wiring line 20b.

Evaluation 3

The stress applied to the extensible and contractible wiring line 20a when the extensible and contractible mounting board according to Example 1 was extended by 10% in the X-axis direction (extension direction of the extensible and contractible wiring lines 20a and 20b) was simulated by using the finite element method (FEM) while changing a depth X (dimension in the X-axis direction) of the cutout portion 41a of the hard resin portion 40a. The evaluation point of the stress was set at the end portion 80a of the contact region between the extensible and contractible wiring line 20a and the hard resin portion 40a. Other simulation conditions were set in the same manner as in Evaluation 1 described above.

Figure 25:
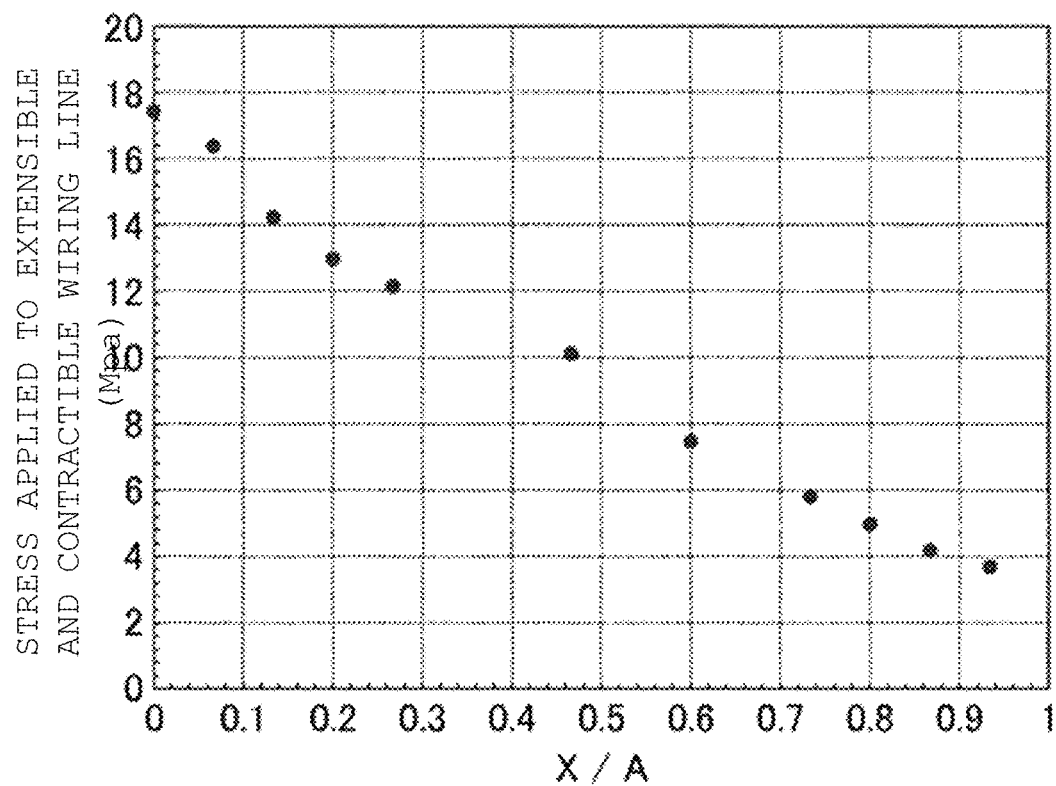
FIG. 25 is a graph illustrating a relationship between a depth of a cutout portion of a hard resin portion, and the stress applied to the extensible and contractible wiring line when the extensible and contractible mounting board according to Example 1 extends.

FIG. 25 is a graph showing a relationship between a depth of the cutout portion of the hard resin portion and a stress applied to the extensible and contractible wiring line when the extensible and contractible mounting board according to Example 1 extends. For "X/A" represented on a horizontal axis in FIG. 25, a length A (dimension in the X-axis direction) of the hard resin portion 40a protruding from the end portion 60a of the connection region between the extensible and contractible wiring line 20a and the electronic component 30 was set to, for example, 1.5 mm. As shown in FIG. 25, the stress applied to the extensible and contractible wiring line 20a became small as X/A became large. The stress applied to the extensible and contractible wiring line 20a dropped sharply around X/A=0.45. When X/A≥1, since the end portion 60a of the connection region between the extensible and contractible wiring line 20a and the electronic component 30 was exposed from the hard resin portion 40a, the effect of reducing the stress applied to the extensible and contractible wiring line 20a was not exhibited. From the above, it was found that a case where 0.45≤X/A<1 was preferable.

Evaluation 4

The stress applied to the extensible and contractible wiring line 20a when the extensible and contractible mounting board according to Example 1 was extended by 9% in the X-axis direction (extension direction of the extensible and contractible wiring lines 20a and 20b) was simulated by using the finite element method (FEM) while changing a width Y (dimension in the Y-axis direction) of the cutout portion 41a of the hard resin portion 40a (fixed to X=1.4 mm). The evaluation point of the stress was set at the end portion 80a of the contact region between the extensible and contractible wiring line 20a and the hard resin portion 40a. Other simulation conditions were set in the same manner as in Evaluation 1 described above.

Figure 26:
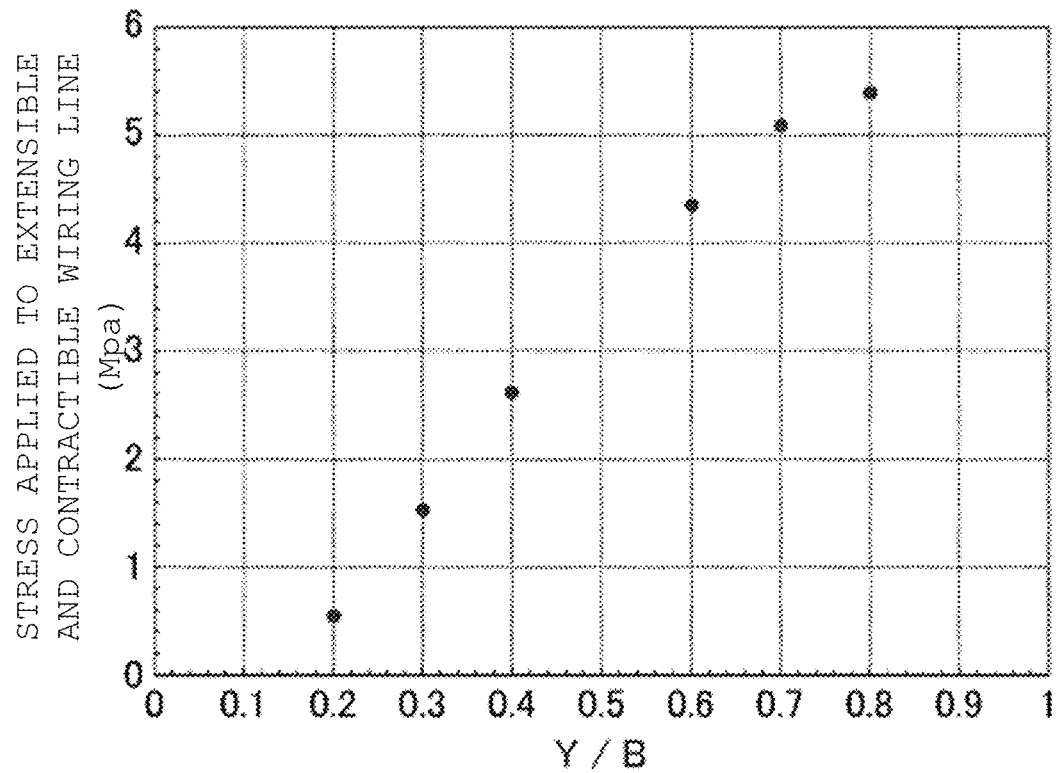
FIG. 26 is a graph illustrating a relationship between a width of the cutout portion of the hard resin portion and the stress applied to the extensible and contractible wiring line when the extensible and contractible mounting board according to Example 1 extends.

FIG. 26 is a graph showing a relationship between a width of the cutout portion of the hard resin portion and a stress applied to the extensible and contractible wiring line when the extensible and contractible mounting board according to Example 1 extends. As shown in FIG. 26, the stress applied to the extensible and contractible wiring line 20a became small as Y/B became small. The stress applied to the extensible and contractible wiring line 20a dropped sharply around Y/B=0.7. From the above, it was found that a case where 0.2≤Y/B≤0.7 was preferable.

Evaluation 5

As shown in FIG. 3, the cutout portion of the extensible and contractible mounting board according to Example 1 had an R shape. In such a state, the stress applied to the extensible and contractible wiring line 20a when the extensible and contractible mounting board according to Example 1 was extended by 10% in the X-axis direction (extension direction of the extensible and contractible wiring lines 20a and 20b) was simulated by using the finite element method (FEM) while changing a radius C of the cutout portion (fixed to X=1.4 mm and Y=0.4 mm). The evaluation point of the stress was set at the end portion 80a of the contact region between the extensible and contractible wiring line 20a and the hard resin portion 40a. Other simulation conditions were set in the same manner as in Evaluation 1 described above.

Figure 27:
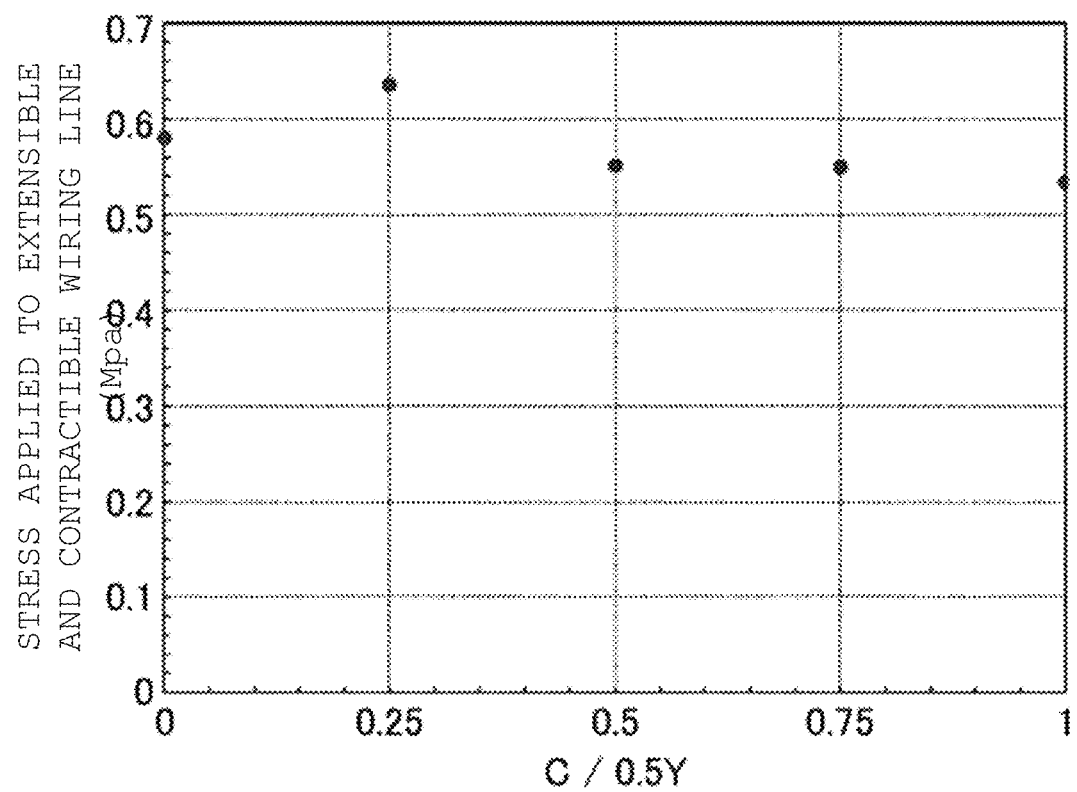
FIG. 27 is a graph illustrating a relationship between a radius of the cutout portion of the hard resin portion and the stress applied to the extensible and contractible wiring line when the extensible and contractible mounting board according to Example 1 extends.

FIG. 27 is a graph showing the relationship between a radius of the cutout portion of the hard resin portion and a stress applied to the extensible and contractible wiring line when the extensible and contractible mounting board according to Example 1 extends. As shown in FIG. 27, since the stress applied to the extensible and contractible wiring line 20a became smaller, it was found that a case where 0.5≤C/0.5Y≤1 was preferable.

Evaluation 6

The stress applied to the extensible and contractible wiring lines 20a and 20b when the extensible and contractible mounting boards according to Example 1 and Example 2 were extended by 7% in the X-axis direction (extension direction of the extensible and contractible wiring lines 20a and 20b) was simulated by using finite element method (FEM). The simulation conditions were set in the same manner as in Evaluation 1 described above except that the soft resin portion 70 was set as follows. The evaluation point of the stress was also set in the same manner as in Evaluation 1 described above.

Figure 28:
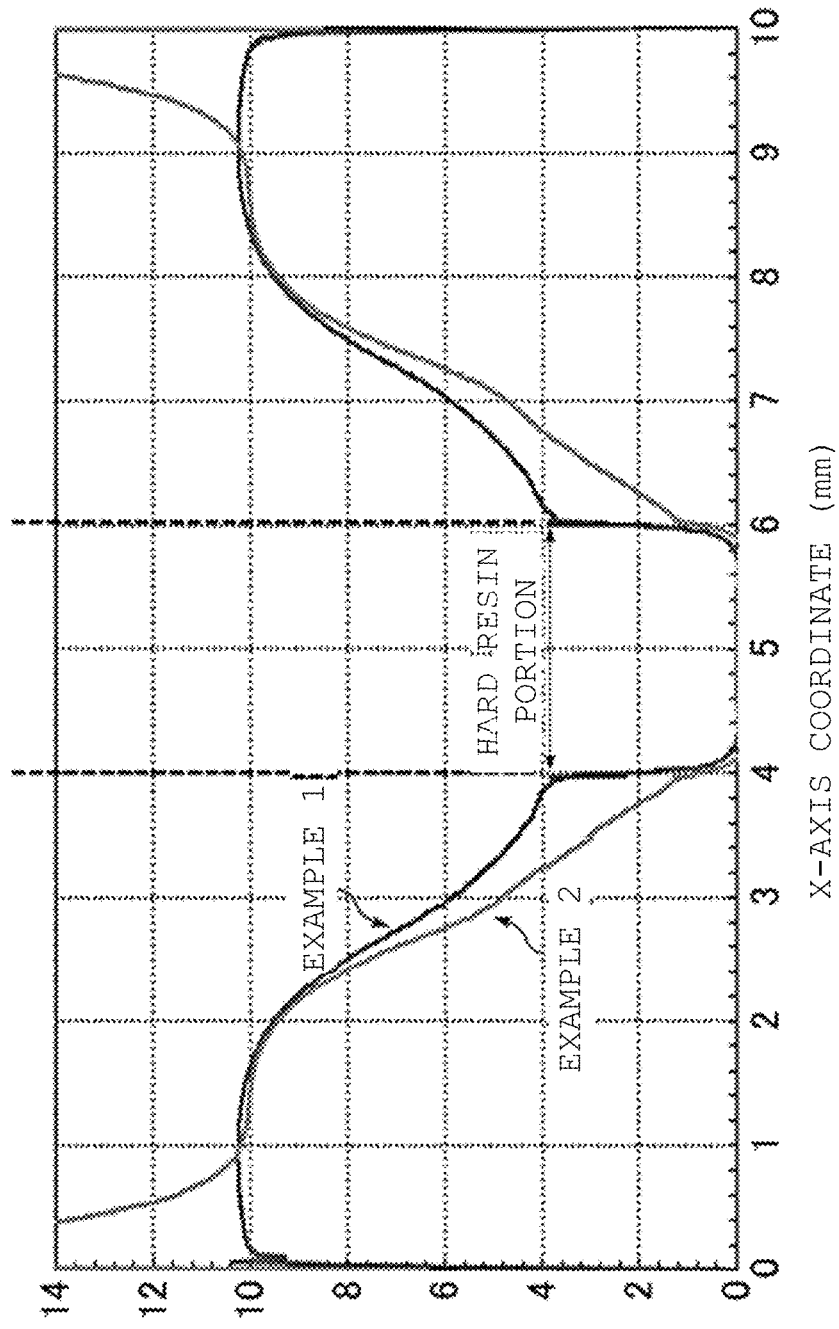
FIG. 28 is a graph illustrating simulation results of the stress applied to the extensible and contractible wiring line when the extensible and contractible mounting boards according to Example 1 and Example 2 extend.

(Soft resin portion 70)
length in X-axis direction: 10 mm
length in Y-axis direction: 4 mm
length in Z-axis direction: 0.3 mm
Young's modulus: 9.9 MPa
Poisson's ratio: 0.48
mesh condition: 0.2 mm FIG. 28 is a graph showing simulation results of the stress applied to the extensible and contractible wiring lines when the extensible and contractible mounting boards according to Example 1 and Example 2 extend. A horizontal axis in FIG. 28 represents the same X-axis coordinate (unit: mm) as the horizontal axis in FIG. 22.

As shown in FIG. 28, the stress applied to the extensible and contractible wiring line 20a was smaller in the vicinity of the end portion 80a of the contact region between the extensible and contractible wiring line 20a and the hard resin portion 40a in Example 2 than in Example 1. Accordingly, the effect of reducing the stress by arranging the soft resin portion 70 in addition to the hard resin portion 40a was confirmed. The above effect of reducing the stress was also confirmed for the extensible and contractible wiring line 20b.

DESCRIPTION OF REFERENCE SYMBOLS 1a, 1b, 1c, 1d, 1e, 1f, 1g, 1h: Extensible and contractible mounting board
10a, 10b, 10c: Extensible and contractible substrate
11a, 11b, 11c, 11d: Substrate layer
20a, 20b, 20c, 20d, 20e, 20f: Extensible and contractible wiring line
21a, 21b: First wiring line portion
22a, 22b: Second wiring line portion
30: Electronic component
40a, 40b, 40c: Hard resin portion
41a, 41b, 41c, 41d, 41e, 41f, 41g, 41h: Cutout portion
42: First resin portion
43: Second resin portion
44a, 44b, 44c, 44d: Resin layer
50a, 50b, 50c, 50d, 50e, 50f: Connection portion
60a, 60b, 60c, 60d, 60e, 60f: End portion of connection region between extensible and contractible wiring line and electronic component
70: Soft resin portion
80a, 80b: End portion of contact region between extensible and contractible wiring line and hard resin portion

The invention claimed is:

1. An extensible and contractible mounting board comprising:
an extensible and contractible substrate;
an extensible and contractible wiring line on one main surface of the extensible and contractible substrate;
an electronic component electrically connected to the extensible and contractible wiring line; and
a resin portion in contact with the extensible and contractible wiring line on a side thereof that is opposite to the extensible and contractable substrate in a plan view of the extensible and contractable mounting board, the resin portion covering the electronic component on a side thereof that is opposite to the extensible and contractible substrate in the plan view of the extensible and contractable mounting board, and the resin portion overlapping an end portion of a connection region between the extensible and contractible wiring line and the electronic component in the plan view of the extensible and contractible mounting board, the resin portion having a cutout portion that overlaps the extensible and contractible wiring line, wherein a Young's modulus of the resin portion is higher than a Young's modulus of the extensible and contractible substrate.

2. The extensible and contractible mounting board according to claim 1, wherein the cutout portion overlaps the extensible and contractible wiring line in the plan view.

3. The extensible and contractible mounting board according to claim 1, wherein the cutout portion overlaps the extensible and contractible wiring line in a section view of the extensible and contractible mounting board.

4. The extensible and contractible mounting board according to claim 3, wherein the resin portion is a first resin portion and the extensible and contractable mounting board includes a second resin portion in contact with a side of the extensible and contractible wiring line proximal to the extensible and contractible substrate and is in contact with the extensible and contractible substrate.

5. The extensible and contractible mounting board according to claim 4, wherein the second resin portion is embedded in the extensible and contractible substrate.

6. The extensible and contractible mounting board according to claim 1, wherein $0.45 \leq X/A < 1$, where X is a depth of the cutout portion and A is a length of the resin portion protruding from the end portion of the connection region between the extensible and contractible wiring line and the electronic component in a same direction as the depth of the cutout portion.

7. The extensible and contractible mounting board according to claim 6, wherein $0.2 \leq Y/B \leq 0.7$, where Y is a width of the cutout portion and B is a width of the resin portion in a same direction as the width of the cutout portion.

8. The extensible and contractible mounting board according to claim 6, wherein $0.5 \leq C/0.5Y \leq 1$, where a corner portion of the cutout portion proximal to the electronic component has a radius C, and Y is a width of the cutout portion.

9. The extensible and contractible mounting board according to claim 1, wherein $0.2 \leq Y/B \leq 0.7$, where Y is a width of the cutout portion and B is a width of the resin portion in a same direction as the width of the cutout portion.

10. The extensible and contractible mounting board according to claim 1, wherein $0.5 \leq C/0.5Y \leq 1$, where a corner portion of the cutout portion proximal to the electronic component has a radius C, and Y is a width of the cutout portion.

11. The extensible and contractible mounting board according to claim 1, wherein the extensible and contractible wiring line has a first wiring line portion and a second wiring line portion, the first wiring line portion is connected to the electronic component, and the second wiring line portion overlaps the cutout portion and is wider than the first wiring line portion in the plan view.

12. The extensible and contractible mounting board according to claim 1, wherein a constituent material of the extensible and contractible substrate is an elastomer-based resin.

13. The extensible and contractible mounting board according to claim 1, wherein a constituent material of the resin portion is at least one of polyvinyl chloride, polyethylene, polystyrene, polycarbonate, polyvinylidene fluoride, polyimide, liquid crystal polymer, polytetrafluoroethylene, phenol resins, epoxy-based resins, urethane-based resin, acrylic-based resins, silicone-based resins, and styrene-butadiene-based resins.

14. The extensible and contractible mounting board according to claim 1, wherein the resin portion is a first resin portion and the extensible and contractable mounting board further comprises a second resin portion covering the first resin portion.

15. The extensible and contractible mounting board according to claim 14, wherein the second resin portion has a Young's modulus lower than that of the first resin portion.

16. The extensible and contractible mounting board according to claim 1, further comprising a connection portion interposed between the electronic component and the extensible and contractible wiring line, and electrically connecting the electronic component to the extensible and contractible wiring line.

* * * * *